(12) United States Patent
Jiang et al.

(10) Patent No.: US 10,982,818 B2
(45) Date of Patent: *Apr. 20, 2021

(54) HIGH LIGHT-EMITTING EFFICIENCY LED LIGHT BULB HAVING FILAMENT WITH CONTROLLED REFRACTIVE INDEX DIFFERENCES OF MULTIPLE INTERFACES

(71) Applicant: ZHEJIANG SUPER LIGHTING ELECTRIC APPLIANCE CO., LTD, Zhejiang (CN)

(72) Inventors: Tao Jiang, Zhejiang (CN); Wei-Hong Xu, Zhejiang (CN); Yukihiro Saito, Zhejiang (CN); Hayato Unagiike, Zhejiang (CN); Ai-Ming Xiong, Zhejiang (CN); Jun-Feng Xu, Zhejiang (CN); Yi-Ching Chen, Taichung (TW)

(73) Assignee: ZHEJIANG SUPER LIGHTING ELECTRIC APPLIANCE CO., LTD, Jinyun (CN)

( * ) Notice: Subject to any disclaimer, the term of this patent is extended or adjusted under 35 U.S.C. 154(b) by 119 days.

This patent is subject to a terminal disclaimer.

(21) Appl. No.: 16/406,052

(22) Filed: May 8, 2019

(65) Prior Publication Data

US 2019/0264874 A1    Aug. 29, 2019

Related U.S. Application Data

(63) Continuation of application No. 16/234,124, filed on Dec. 27, 2018, now Pat. No. 10,845,008, which is a
(Continued)

(30) Foreign Application Priority Data

Sep. 28, 2014 (CN) .......................... 201410510593.6
Feb. 2, 2015 (CN) .......................... 201510053077.X
(Continued)

(51) Int. Cl.
*F21K 9/61* (2016.01)
*F21K 9/232* (2016.01)
(Continued)

(52) U.S. Cl.
CPC ................ *F21K 9/232* (2016.08); *F21K 9/61* (2016.08); *F21V 15/04* (2013.01); *H01L 33/00* (2013.01);
(Continued)

(58) Field of Classification Search
CPC . F21K 9/61; F21K 9/232; F21V 15/04; F21Y 2115/10; H05B 33/0806
See application file for complete search history.

(56) References Cited

U.S. PATENT DOCUMENTS 8,455,895 B2    6/2013    Chai et al.
8,933,619 B1    1/2015    Ou
(Continued)

FOREIGN PATENT DOCUMENTS

CN    202252991 U    5/2012
CN    102751274 A    10/2012
(Continued)

*Primary Examiner* — Bijan Ahvazi
(74) *Attorney, Agent, or Firm* — Simon Kuang Lu

(57) ABSTRACT

An light bulb comprise a lamp housing filled with gas which doped with a golden yellow material or coated with a yellow film on its surface; a bulb base, connected with the lamp housing; a stem with a stand extending to the center of the lamp housing, disposed in the lamp housing; a LED filament disposed in the lamp housing, at least a half of the LED filament is around a center axle of the LED light bulb, where the center axle of the LED light bulb is coaxial with the axle of the stand, two conductive supports, respectively connected with the stem and the LED filament; a driving circuit, electrically connected with both the conductive supports and the bulb base.

20 Claims, 4 Drawing Sheets

Related U.S. Application Data continuation-in-part of application No. 15/858,036, filed on Dec. 29, 2017, now Pat. No. 10,544,905, which is a continuation-in-part of application No. 29/627,379, filed on Nov. 27, 2017, now Pat. No. Des. 879,330, and a continuation-in-part of application No. 29/619,287, filed on Sep. 28, 2017, now Pat. No. Des. 862,740, and a continuation-in-part of application No. 15/723,297, filed on Oct. 3, 2017, now Pat. No. 10,655,792, which is a continuation-in-part of application No. 15/168,541, filed on May 31, 2016, now Pat. No. 9,995,474, and a continuation-in-part of application No. 15/308,995, filed as application No. PCT/CN2015/090815 on Sep. 25, 2015, now Pat. No. 10,781,979, and a continuation-in-part of application No. 15/499,143, filed on Apr. 27, 2017, now Pat. No. 10,240,724, which is a continuation-in-part of application No. 15/384,311, filed on Dec. 19, 2016, now Pat. No. 10,487,987, which is a continuation-in-part of application No. 15/366,535, filed on Dec. 1, 2016, now Pat. No. 10,473,271, which is a continuation-in-part of application No. 15/237,983, filed on Aug. 16, 2016, now Pat. No. 10,228,093.

(30) Foreign Application Priority Data

| Date | | Number |
|---|---|---|
| Jun. 10, 2015 | (CN) | 201510316656.9 |
| Jun. 19, 2015 | (CN) | 201510347410.8 |
| Aug. 7, 2015 | (CN) | 201510489363.0 |
| Aug. 17, 2015 | (CN) | 201510502630.3 |
| Sep. 2, 2015 | (CN) | 201510555889.4 |
| Dec. 19, 2015 | (CN) | 201510966906.3 |
| Jan. 22, 2016 | (CN) | 201610041667.5 |
| Apr. 27, 2016 | (CN) | 201610272153.0 |
| Apr. 29, 2016 | (CN) | 201610281600.9 |
| Jun. 3, 2016 | (CN) | 201610394610.3 |
| Jul. 7, 2016 | (CN) | 201610544049.2 |
| Jul. 22, 2016 | (CN) | 201610586388.7 |
| Nov. 1, 2016 | (CN) | 201610936171.4 |
| Dec. 6, 2016 | (CN) | 201611108722.4 |
| Jan. 13, 2017 | (CN) | 201710024877.8 |
| Feb. 14, 2017 | (CN) | 201710079423.0 |
| Mar. 9, 2017 | (CN) | 201710138009.2 |
| Mar. 23, 2017 | (CN) | 201710180574.5 |
| Apr. 11, 2017 | (CN) | 201710234618.8 |
| May 8, 2017 | (CN) | 201710316641.1 |
| Sep. 18, 2017 | (CN) | 201710839083.7 |
| Sep. 21, 2017 | (CN) | 201730450712.8 |
| Sep. 22, 2017 | (CN) | 201730453237.X |
| Sep. 22, 2017 | (CN) | 201730453239.9 |
| Sep. 26, 2017 | (CN) | 201710883625.0 |
| Oct. 16, 2017 | (CN) | 201730489929.X |
| Oct. 27, 2017 | (CN) | 201730517887.6 |
| Oct. 30, 2017 | (CN) | 201730520672.X |
| Nov. 3, 2017 | (CN) | 201730537542.7 |
| Nov. 3, 2017 | (CN) | 201730537544.6 |
| Dec. 26, 2017 | (CN) | 201711434993.3 |
| Dec. 29, 2017 | (CN) | 201711477767.3 |
| Jan. 12, 2018 | (CN) | 201810031786.1 |
| Jan. 23, 2018 | (CN) | 201810065369.9 |
| Apr. 17, 2018 | (CN) | 201810343825.1 |
| Apr. 17, 2018 | (CN) | 201810344630.9 |
| May 23, 2018 | (CN) | 201810498980.0 |
| May 23, 2018 | (CN) | 201810501350.4 |
| Jun. 6, 2018 | (CN) | 201810573314.9 |
| Jul. 26, 2018 | (CN) | 201810836433.9 |
| Aug. 17, 2018 | (CN) | 201810943054.X |
| Aug. 30, 2018 | (CN) | 201811005145.5 |
| Aug. 30, 2018 | (CN) | 201811005536.7 |
| Sep. 17, 2018 | (CN) | 201811079889.1 |
| Oct. 30, 2018 | (CN) | 201811277980.4 |
| Oct. 31, 2018 | (CN) | 201811285657.1 |
| Nov. 19, 2018 | (CN) | 201811378173.1 |
| Nov. 19, 2018 | (CN) | 201811378189.2 |
| Dec. 18, 2018 | (CN) | 201811549205.X |

(51) Int. Cl.

| | |
|---|---|
| *F21V 15/04* | (2006.01) |
| *H05B 33/08* | (2020.01) |
| *H01L 33/00* | (2010.01) |
| *H05B 45/00* | (2020.01) |
| *F21Y 115/10* | (2016.01) |
| *F21Y 107/70* | (2016.01) |
| *H01L 33/50* | (2010.01) |
| *H01L 33/54* | (2010.01) |
| *H01L 33/62* | (2010.01) |

(52) U.S. Cl.
CPC .......... *H05B 45/00* (2020.01); *F21Y 2107/70* (2016.08); *F21Y 2115/10* (2016.08); *H01L 33/505* (2013.01); *H01L 33/54* (2013.01); *H01L 33/62* (2013.01)

(56) References Cited

U.S. PATENT DOCUMENTS

| | | | |
|---|---|---|---|
| 9,016,900 B2 | 4/2015 | Takeuchi et al. | |
| 9,761,765 B2 | 9/2017 | Basin et al. | |
| 9,982,854 B2* | 5/2018 | Ma | H01L 33/52 |
| 2004/0008525 A1 | 1/2004 | Shibata | |
| 2013/0058080 A1* | 3/2013 | Ge | F21V 19/005 |
| | | | 362/231 |
| 2013/0058580 A1 | 3/2013 | Ge et al. | |
| 2013/0147348 A1 | 6/2013 | Motoya et al. | |
| 2013/0235592 A1 | 9/2013 | Takeuchi et al. | |
| 2013/0293098 A1 | 11/2013 | Li et al. | |
| 2014/0268779 A1 | 9/2014 | Sorensen et al. | |
| 2014/0369036 A1 | 12/2014 | Feng | |
| 2015/0069442 A1 | 3/2015 | Liu et al. | |
| 2015/0070871 A1 | 3/2015 | Chen et al. | |
| 2015/0255440 A1 | 9/2015 | Hsieh | |
| 2017/0012177 A1 | 1/2017 | Trottier | |
| 2019/0186697 A1* | 6/2019 | Jiang | H05B 45/37 |
| 2019/0195434 A1* | 6/2019 | Jiang | F21K 9/232 |
| 2019/0264875 A1* | 8/2019 | Jiang | F21K 9/232 |
| 2019/0271443 A1* | 9/2019 | Jiang | H05B 45/20 |
| 2019/0301683 A1* | 10/2019 | Jiang | F21K 9/232 |

FOREIGN PATENT DOCUMENTS

| | | | |
|---|---|---|---|
| CN | 103123949 | A | 5/2013 |
| CN | 203367275 | U | 12/2013 |
| CN | 103560128 | A | 2/2014 |
| CN | 203628391 | U | 6/2014 |
| CN | 203656627 | U | 6/2014 |
| CN | 103939758 | A | 7/2014 |
| CN | 103956421 | A | 7/2014 |
| CN | 103972364 | A | 8/2014 |
| CN | 103994349 | A | 8/2014 |
| CN | 203857313 | U | 10/2014 |
| CN | 203880468 | U | 10/2014 |
| CN | 204062539 | U | 12/2014 |
| CN | 104319345 | A | 1/2015 |
| CN | 204083941 | U | 1/2015 |
| CN | 104456165 | A | 3/2015 |
| CN | 204289439 | U | 4/2015 |
| CN | 104600174 | A | 5/2015 |
| CN | 104600181 | A | 5/2015 |

(56) References Cited

FOREIGN PATENT DOCUMENTS

| | | |
|---|---|---|
| CN | 204328550 U | 5/2015 |
| CN | 204387765 U | 6/2015 |
| CN | 105140381 A | 12/2015 |
| CN | 105161608 A | 12/2015 |
| CN | 105371243 A | 3/2016 |
| CN | 105609621 A | 5/2016 |
| CN | 106468405 A | 3/2017 |
| CN | 106898681 A | 6/2017 |
| CN | 107123641 A | 9/2017 |
| CN | 107170733 A | 9/2017 |
| CN | 206563190 U | 10/2017 |
| CN | 107314258 A | 11/2017 |
| CN | 206973307 U | 2/2018 |
| CN | 207034659 U | 2/2018 |
| CN | 108039402 A | 5/2018 |
| CN | 105090782 B | 7/2018 |
| CN | 105098032 A | 7/2018 |
| CN | 207849021 U | 9/2018 |
| EP | 2760057 A1 | 7/2014 |
| EP | 2567145 B1 | 4/2016 |
| GB | 2547085 A | 8/2017 |
| JP | 3075689 U | 2/2001 |
| JP | 2001126510 A | 5/2001 |
| JP | 2003037239 A | 2/2003 |
| JP | 2013225587 A | 10/2013 |
| WO | 2014167458 A1 | 10/2014 |
| WO | 2017037010 A1 | 3/2017 |

* cited by examiner

HIGH LIGHT-EMITTING EFFICIENCY LED LIGHT BULB HAVING FILAMENT WITH CONTROLLED REFRACTIVE INDEX DIFFERENCES OF MULTIPLE INTERFACES

CROSS-REFERENCE TO RELATED APPLICATIONS

This application is a continuation application of U.S. application Ser. No. 16/234,124 filed on Dec. 2018, 27, which claims priority to Chinese Patent Applications No. 201510502630.3 filed on 2015 Aug. 17; No. 201510966906.3 filed on 2015 Dec. 19; No. 201610041667.5 filed on 2016 Jan. 22; No. 201610272153.0 filed on 2016 Apr. 27; No. 201610394610.3 filed on 2016 Jun. 3; No. 201610586388.7 filed on 2016 Jul. 22; No. 201610544049.2 filed on 2016 Jul. 7; No. 201610936171.4 filed on 2016 Nov. 1; No. 201611108722.4 filed on 2016 Dec. 6; No. 201610281600.9 filed on 2016 Apr. 29; No. 201710024877.8 filed on 2017 Jan. 13; No. 201710079423.0 filed on 2017 Feb. 14; No. 201710138009.2 filed on 2017 Mar. 9; No. 201710180574.5 filed on 2017 Mar. 23; No. 201710234618.8 filed on 2017 Apr. 11; No. 201410510593.6 filed on 2014 Sep. 28; No. 201510053077.X filed on 2015 Feb. 2; No. 201510316656.9 filed on 2015 Jun. 10; No. 201510347410.8 filed on 2015 Jun. 19; No. 201510489363.0 filed on 2015 Aug. 7; No. 201510555889.4 filed on 2015 Sep. 2; No. 201710316641.1 filed on 2017 May 8; No. 201710839083.7 filed on 2017 Sep. 18; No. 201710883625.0 filed on 2017 Sep. 26; No. 201730450712.8 filed on 2017 Sep. 21; No. 201730453239.9 filed on 2017 Sep. 22; No. 201730453237.X filed on 2017 Sep. 22; No. 201730537542.7 filed on 2017 Nov. 3; No. 201730537544.6 filed on 2017 Nov. 3; No. 201730520672.X filed on 2017 Oct. 30; No. 201730517887.6 filed on 2017 Oct. 27; No. 201730489929.X filed on 2017 Oct. 16; No. 201711434993.3 filed on 2017 Dec. 26; No. 201711477767.3 filed on 2017 Dec. 29; No. 201810031786.1 filed on 2018 Jan. 12; No. 201810065369.9 filed on 2018 Jan. 23; No. 201810343825.1 filed on 2018 Apr. 17; No. 201810344630.9 filed on 2018 Apr. 17; No. 201810501350.4 filed on 2018 May 23; No. 201810498980.0 filed on 2018 May 23; No. 201810573314.9 filed on 2018 Jun. 6; No. 201810836433.9 filed on 2018 Jul. 26; No. 201810943054.X filed on 2018 Aug. 17; No. 201811005536.7 filed on 2018 Aug. 30; No. 201811005145.5 filed on 2018 Aug. 30; No. 201811079889.1 filed on 2018 Sep. 17; No. 201811277980.4 filed on 2018 Oct. 30; No. 201811285657.1 filed on 2018 Oct. 31; No. 201811378173.1 filed on 2018 Nov. 19; No. 201811378189.2 filed on 2018 Nov. 19; No. 201811549205.X filed on 2018 Dec. 18, each of which is hereby incorporated by reference in its entirety.

TECHNICAL FIELD

The present disclosure relates to a lighting field, and more particularly to a high light-emitting efficiency LED light bulb having filament with controlled refractive index differences of multiple interfaces.

RELATED ART

Incandescent bulbs have been widely used for homes or commercial lighting for decades. However, incandescent bulbs are generally with lower efficiency in terms of energy application, and about 90% of energy input can be converted into a heat form to dissipate. In addition, because the incandescent bulb has a very limited lifespan (about 1,000 hours), it needs to be frequently replaced. These traditional incandescent bulbs are gradually replaced by other more efficient lighting devices, such as fluorescent lights, high-intensity discharge lamps, light-emitting diodes (LEDs) lights and the like. In these electric lamps, the LED light lamp attracts widespread attention in its lighting technology. The LED light lamp has the advantages of long lifespan, small in size, environmental protection and the like, therefore the application of the LED light lamp continuously grows.

there is one kind of LED soft filament, which is employed a flexible printed circuit substrate (hereinafter referred to FPC) instead of the glass substrate to enable the LED filament having a certain degree of bending. However, by utilizing the LED soft filament made of the FPC, the FPC has a thermal expansion coefficient different from that of the silicon gel coated covering the LED soft filament, and the long-term use causes the displacement or even degumming of the LED chips. Moreover, the FPC may not beneficial to flexible adjustment of the process conditions and the like. Besides, during bending the LED soft filament it has a challenge in the stability of the metal wire bonded between LED chips. When the arrangement of the LED chips in the LED soft filament is dense, if the adjacent LED chips are connected by means of metal wire bonding, it is easy to cause the stress to be concentrated on a specific part of the LED soft filament when the LED soft filament is bent, thereby the metal wire bonding between the LED chips are damaged and even broken.

In addition, the LED filament is generally disposed inside the LED light bulb, and in order to present the aesthetic appearance and also to make the illumination of the LED filament more uniform and widespread, the LED filament is bent to exhibit a plurality of curves. Since the LED chips are arranged in the LED filaments, and the LED chips are relatively hard objects, it is difficult for the LED filaments to be bent into a desired shape. Moreover, the LED filament is also prone to cracks due to stress concentration during bending.

Patent No. CN105161608A discloses an LED filament light-emitting strip and a preparation method thereof. Wherein the LED chips are disposed without overlapped, and the light-emitting surfaces of the LED chips are correspondingly arranged, so that the light emitting uniformity and heat dissipation is improved accordingly. Patent No. CN103939758A discloses that a transparent and thermally conductive heat dissipation layer is formed between the interface of the carrier and the LED chip for heat exchange with the LED chip. According to the aforementioned patents, which respectively use a PCB board, adjust the chips arrangement or form a heat dissipation layer, the heat dissipation of the filament of the lamp can be improved to a certain extent correspondingly; however, the heat is easy to accumulate due to the low efficiency in heat dissipation. The last one, Publication No. CN204289439U discloses an LED filament with omni-directional light comprising a substrate mixed with phosphors, at least one electrode disposed on the substrate, at least one LED chip mounted on the substrate, and the encapsulant coated on the LED chip. The substrate formed by the silicone resin contained with phosphors eliminates the cost of glass or sapphire as a substrate, and the LED filament equipping with this kind of substrate avoids the influence of glass or sapphire on the light emitting of the LED chip. The 360-degree light emitting is realized, and the illumination uniformity and the light efficiency are greatly improved. However, due to the fact that the substrate is formed by silicon resin, the defect of poor heat resistance is a disadvantage.

SUMMARY

It is noted that the present disclosure includes one or more inventive solutions currently claimed or not claimed, and in order to avoid confusion between the illustration of these embodiments in the specification, a number of possible inventive aspects herein may be collectively referred to "present/the invention."

A number of embodiments are described herein with respect to "the invention." However, the word "the invention" is used merely to describe certain embodiments disclosed in this specification, whether or not in the claims, is not a complete description of all possible embodiments. Some embodiments of various features or aspects described below as "the invention" may be combined in various ways to form an LED light bulb or a portion thereof.

In accordance with another embodiment of the present invention, an LED filament comprises at least one LED section, a conductive section, at least two conductive electrodes and a light conversion layer. The conductive section is located between two adjacent LED sections. The two conductive electrodes are disposed on the LED filament correspondingly and electrically connected to each of the LED sections. The adjacent two LED sections are electrically connected to each other through the conductive section. Each of the LED sections includes at least two LED chips, and the LED chips are electrically connected to each other by at least one wire. The light conversion layer covers the LED sections, the conductive sections and the conductive electrodes, and a part of each of the two electrodes is exposed respectively.

In accordance with an embodiment of the present invention, the conductive section includes a conductor connecting with the LED section, and the length of the wire connecting between the LED chips is less than the length of the conductor.

In accordance with an embodiment of the present invention, the light conversion layer includes at least one top layer and one base layer.

In accordance with another embodiment of the present invention provides a composition which is suitable for use as a filament substrate or a light conversion layer, wherein the composition comprises at least a main material, a modifier and an additive. The main material is an organosilicon-modified polyimide; the modifier is a thermal curing agent; and the additives comprise microparticles added into the main material, which may comprise phosphor particles, heat dispersing particles. The additive also comprises a coupling agent.

The present disclosure provides a composition which is suitable for use as a filament substrate or a light-conversion layer, wherein the main material in the composition is an organosilicon-modified polyimide, i.e. a polyimide comprising a siloxane moiety, wherein the organosilicon-modified polyimide comprises a repeating unit represented by the general Formula (I):

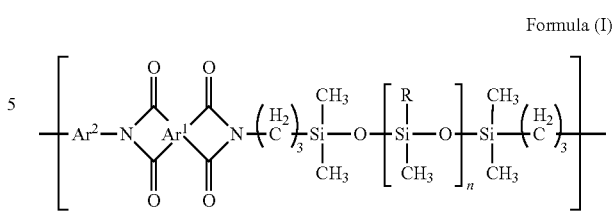

Formula (I)

In general Formula (I), $Ar^1$ is a tetra-valent organic group having a benzene ring or an alicyclic hydrocarbon structure, $Ar^2$ is a di-valent organic group, R is each independently methyl or phenyl, and n is 1~5.

According to an embodiment of the present disclosure, $Ar^1$ is a tetra-valent organic group having a monocyclic alicyclic hydrocarbon structure or a bridged-ring alicyclic hydrocarbon structure.

According to another embodiment of the present disclosure, $Ar^2$ is a di-valent organic group having a monocyclic alicyclic hydrocarbon structure.

To make the above and other objects, features, and advantages of the present invention clearer and easier to understand, the following embodiments will be described in detail with reference to the accompanying drawings.

BRIEF DESCRIPTION OF THE DRAWINGS

The present invention will become more readily apparent to those ordinarily skilled in the art after reviewing the following detailed description and accompanying drawings, in which.

DETAILED DESCRIPTION

Figure 1A:
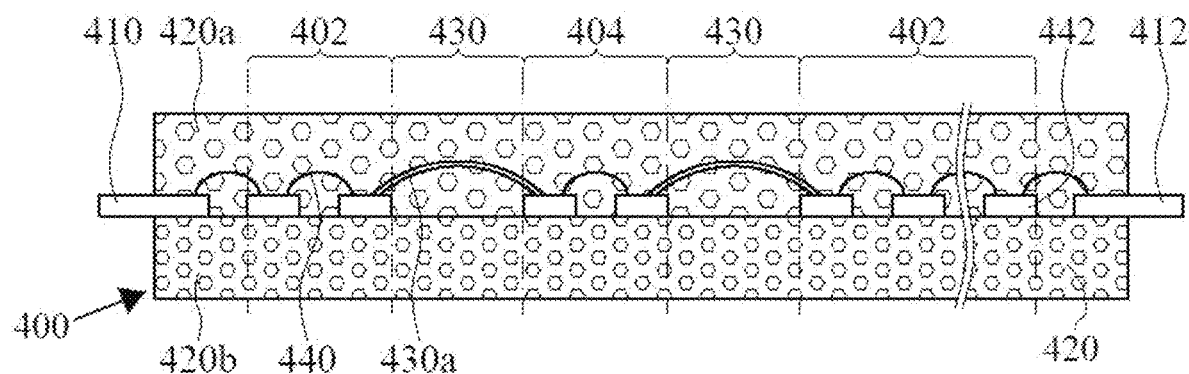
FIG. 1A is a cross sectional view of an LED filament in accordance with an embodiment of the present invention.

The present disclosure provides a novel LED filament and its application the LED light bulb. The present disclosure will now be described in the following embodiments with reference to the drawings. The following descriptions of various implementations are presented herein for purpose of illustration and giving examples only. This invention is not intended to be exhaustive or to be limited to the precise form disclosed. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

In the drawings, the size and relative sizes of components may be exaggerated for clarity. Like numbers refer to like elements throughout.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and the present application, and will not be interpreted in an idealized or overly formal sense unless expressly so defined herein.

Referring to FIG. 1A, FIG. 1A is a schematic structural view of another embodiment of an LED filament of the present invention. As shown in FIG. 1A, the LED filament 400 has a light conversion layer 420, LED sections 402, 404, conductive electrodes 410, 412, and a conductive section 430 for electrically connecting adjacent two LED sections 402, 404. Each of the LED sections 402, 404 includes at least two LED chips 442 that are electrically connected to each other by the wires 440. In the present embodiment, the conductive section 430 includes at least one conductor 430a that connects the adjacent LED sections 402, 404, wherein the shortest distance between the two LED chips 442 respectively located in the two adjacent LED sections 402, 404 is greater than the distance between two adjacent LED chips 442 within the one LED section 402/404. Therefore, it is ensured that when the two LED sections 402, 404 are bent, the conductive section 430 is not easily broken due to the stress of bending. The length of the wire 440 is less than the length of the conductor 430a. The light conversion layer 420 is coated on at least two sides of the LED chip 442 and conductive electrodes 410, 412, and a portion of each of the conductive electrodes 410, 412 is not coated with the light conversion layer 420. The light conversion layer 420 may have at least one top layer 420a (or upper layer) and one base layer 420b (or lower layer). In the present embodiment, the top layer 420a and the base layer 420b are disposed on the opposing surface of the LED chip 442 and conductive electrodes 410, 412, and a portion of each of the conductive electrodes 410, 412 is excluded. The thickness of the top layer 420a is the distance between its outer surface to the interface of the top layer 420a and the base layer 420b, or the distance from its outer surface and the interface of the LED chip 442 or the conductor 430a and the base layer 420b, wherein the outer surface of the top layer 420a is a surface away from the base layer.

Figure 1B:
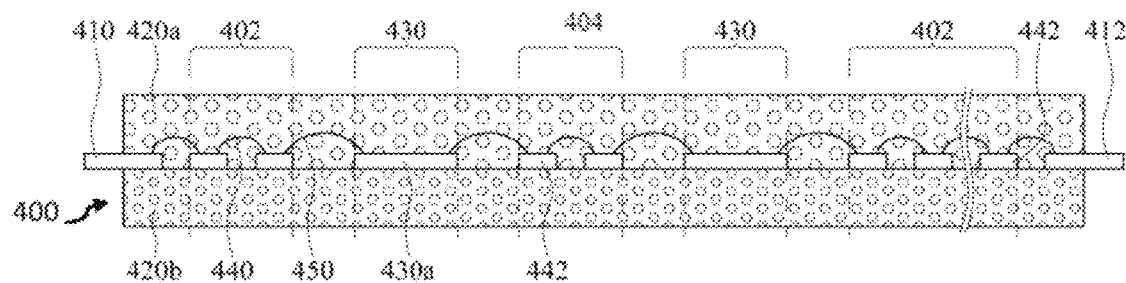
FIGS. 1B to 1C are cross sectional views of various LED filaments in accordance with the present invention.

As shown in FIG. 1B, in the present embodiment, the conductive section 430 is also located between the two adjacent LED sections 402, 404, and the plurality of LED chips 442 in the LED sections 402, 404 are electrically connected to each other through the wires 440. However, the conductor 430a in the conductive section 430 in FIG. 1B is not in the form of a wire but in a sheet or film form. In some embodiments, the conductor 430a can be a copper foil, a gold foil, or other materials that can conduct electrical conduction. In the present embodiment, the conductor 430a is attached to the surface of the base layer 420b and contact with the top layer 420a, that is, located between the base layer 420b and the top layer 420a. Moreover, the conductive section 430 and the LED sections 402, 404 are electrically connected by wires 450, that is, the two closest LED chips 442 respectively located in the adjacent two LED sections 402, 404 are electrically connected by the wires 450 and the conductors 430a of the conductive section 430. Wherein, the length of the conductive section 430 is greater than the distance between two adjacent LED chips of one LED sections 402, 404, and the length of the wire 440 in the LED sections 402, 404 is less than the length of the conductor 430a. This design ensures that the conductive section 430 has good bendability. Assuming that the maximum thickness of the LED chip in the radial direction of the filament is H, the thickness of the conductive electrode and the conductor 430a in the radial direction of the filament is around 0.5 H to 1.4 H, preferably around 0.5 H to 0.7 H. This ensures the wire bonding process can be carried out while ensures the quality of the LED filament and the precision of the wire bonding process, thereby the LED filament has good strength and the stability of the product is improved.

Figure 1C:
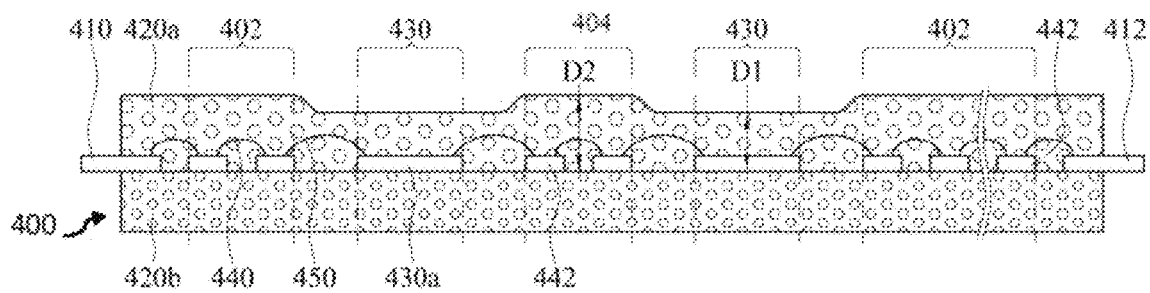

As shown in FIG. 1C, in the present embodiment, the LED sections 402, 404 and the conductive section 430 of the LED filament have different structural features. In the present embodiment, the LED sections 402, 404 and the conductive section 430 have different widths, thicknesses, or diameters in the radial direction of the LED filaments. As shown in FIG. 1C, the conductive section 430 is relatively thinner compared to the LED sections 402, 404, therefore it is helpful to the LED filament curling to various curves. In the present embodiment, the base layer 420b is substantially uniform in width, thickness or diameter in the radial direction of the LED filament, whether in the LED sections 402, 404 or in the conductive section 430. And, the top layer 420a has different widths, thicknesses or diameters in the radial direction of the LED filaments for the LED section 402, 404 and the conductive section 430. As shown in FIG. 1C, the top layer 420a of the LED sections 402, 404 has a maximum diameter D2 in the radial direction of the LED filament, while the top layer 20a of the conductive section 430 has the largest diameter D1 in the radial direction of the LED filament, D2 will be greater than D1. The diameter of the top layer 420a is gradually reduced from the LED sections 402, 404 toward to the conductive section 430, and is gradually increased from the conductive section 430 toward to adjacent LED sections 402, 404, so that the top layer 420a is conformally covered the LED filament and forms a smooth concave-convex curve along the axial direction of the LED filament.

Figure 2:
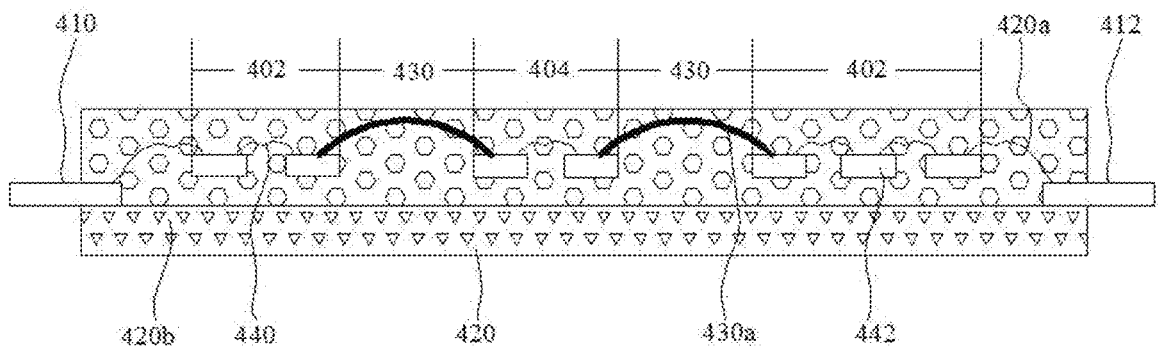
FIG. 2 is a cross sectional view of an LED filament with multiple layers in accordance with an embodiment of the present invention.

FIG. 2 illustrates another embodiment of the LED filament layered structure of the present invention. As shown in FIG. 2, the light conversion layer of LED filament 400 includes a top layer 420a and a base layer 420b. Each side of the LED sections 402, 404 is in direct contact with the top layer 420a, and the base layer 420b is not in contact with the LED sections 402, 404. In the manufacturing process, the base layer 420b can be formed in advance, and the LED sections 402, 404 and the top layer 420a are formed successively.

Figure 3:
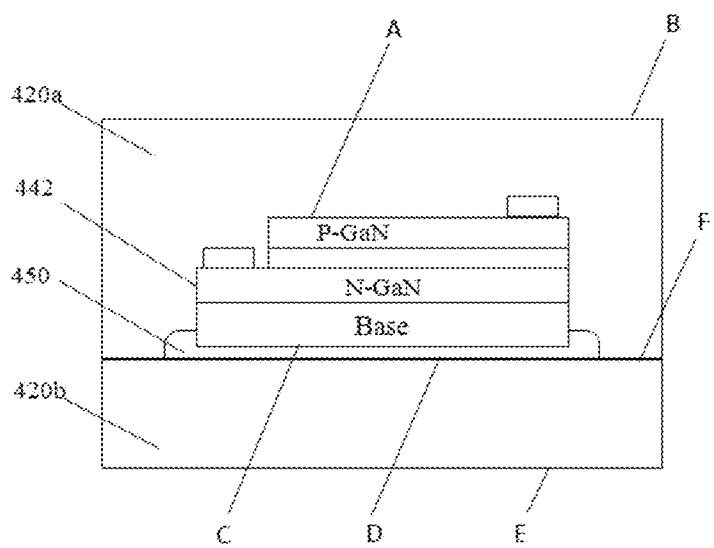
FIG. 3 is a schematic view showing the interfaces passing through by the light emitted by the LED chip in accordance with the present invention.

When the LED filament is illuminated in an LED light bulb encapsulation with the inert gas, as shown in FIG. 3, the light emitted by the LED chip 442 passes through the interfaces A, B, C, D, E and F respectively, wherein the interface A is the interface between the p-GaN gate of the LED chip 442 and the top layer 420a. The interface B is the interface between the top layer 420a and the inert gas, the interface C is the interface between the Base of the LED chip 442 and the paste 450 (e.g., die bond paste), the D interface is the interface between the paste 450 and the base layer 420b, the interface E is the interface between the base layer 420b and the inert gas, and the interface F is the interface between the base layer 420b and the top layer 420a. When light passes through the interfaces A, B, C, D, E and F respectively, the refractive index of the two substances in any interface is n1 and n2 respectively, then |n1−n2|<1.0, preferably |n1−n2|<0.5, more preferably |n1−n2|<0.2. In one embodiment, the refractive index of two substances in any one of the four interfaces of B, E, D and F is n1 and n2 respectively, and then |n1−n2|<1.0, preferably |n1−n2|<0.5, More preferably |n1−n2|<0.2. In one embodiment, the refractive index of two substances in any interface of D and F two interfaces is n1 and n2 respectively, then |n1−n2|<1.0, preferably In1-n21<0.5, preferably |n1−n2|<0.2. The absolute value of the difference in refractive index of the two substances in each interface is smaller, the light emitting efficiency is higher. For example, when the light emitted by the LED chip 442 passes from the base layer 420b to the top layer 420a, the incident angle is θ1, the refraction angle is θ2, and the refractive index of the base layer 420b is n1, and the refractive index of the top layer 420a is n2, according to the equation sin θ1/sin θ2=n2/n1, when the absolute value of the difference between n1 and n2 is smaller, the incident angle closer to the refraction angle, and then the light-emitting efficiency of the LED filament is higher.

The next part will describe the material of the filament of the present invention. The material suitable for manufacturing a filament substrate or a light-conversion layer for LED should have properties such as excellent light transmission, good heat resistance, excellent thermal conductivity, appropriate refraction rate, excellent mechanical properties and good warpage resistance. All the above properties can be achieved by adjusting the type and the content of the main material, the modifier and the additive contained in the organosilicon-modified polyimide composition. The present disclosure provides a filament substrate or a light-conversion layer formed from a composition comprising an organosilicon-modified polyimide. The composition can meet the requirements on the above properties. In addition, the type and the content of one or more of the main material, the modifier (thermal curing agent) and the additive in the composition can be modified to adjust the properties of the filament substrate or the light-conversion layer, so as to meet special environmental requirements. The modification of each property is described herein below.

Adjustment of the Organosilicon-Modified Polyimide

The organosilicon-modified polyimide provided herein comprises a repeating unit represented by the following general Formula (I):

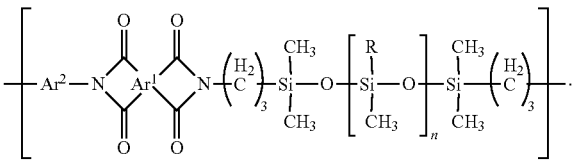

Formula (I)

In general Formula (I), $Ar^1$ is a tetra-valent organic group. The organic group has a benzene ring or an alicyclic hydrocarbon structure. The alicyclic hydrocarbon structure may be monocyclic alicyclic hydrocarbon structure or a bridged-ring alicyclic hydrocarbon structure, which may be a dicyclic alicyclic hydrocarbon structure or a tricyclic alicyclic hydrocarbon structure. The organic group may also be a benzene ring or an alicyclic hydrocarbon structure comprising a functional group having active hydrogen, wherein the functional group having active hydrogen is one or more of hydroxyl, amino, carboxy, amido and mercapto.

Are is a di-valent organic group, which organic group may have for example a monocyclic alicyclic hydrocarbon structure or a di-valent organic group comprising a functional group having active hydrogen, wherein the functional group having active hydrogen is one or more of hydroxyl, amino, carboxy, amido and mercapto.

R is each independently methyl or phenyl.

n is 1~5, preferably 1, 2, 3 or 5.

The polymer of general Formula (I) has a number average molecular weight of 5000~100000, preferably 10000~60000, more preferably 20000~40000. The number average molecular weight is determined by gel permeation chromatography (GPC) and calculated based on a calibration curve obtained by using standard polystyrene. When the number average molecular weight is below 5000, a good mechanical property is hard to be obtained after curing, especially the elongation tends to decrease. On the other hand, when it exceeds 100000, the viscosity becomes too high and the resin is hard to be formed.

$Ar^1$ is a component derived from a dianhydride, which may be an aromatic anhydride or an aliphatic anhydride. The aromatic anhydride includes an aromatic anhydride comprising only a benzene ring, a fluorinated aromatic anhydride, an aromatic anhydride comprising amido group, an aromatic anhydride comprising ester group, an aromatic anhydride comprising ether group, an aromatic anhydride comprising sulfide group, an aromatic anhydride comprising sulfonyl group, and an aromatic anhydride comprising carbonyl group.

Examples of the aromatic anhydride comprising only a benzene ring include pyromellitic dianhydride (PMDA), 2,3,3',4'-biphenyl tetracarboxylic dianhydride (aBPDA), 3,3',4,4'-biphenyl tetracarboxylic dianhydride (sBPDA), and 4-(2,5-dioxotetrahydrofuran-3-yl)-1,2,3,4-tetrahydro naphthalene-1,2-dicarboxylic anhydride (TDA). Examples of the fluorinated aromatic anhydride include 4,4'-(hexafluoroisopropylidene)diphthalic anhydride which is referred to as 6FDA. Examples of the aromatic anhydride comprising amido group include N,N'-(5,5'-(perfluoropropane-2,2-diyl) bis(2-hydroxy-5,1-phenylene))bis(1,3-dioxo-1,3-dihydroisobenzofuran)-5-arboxamide) (6FAP-ATA), and N,N'-(9H-fluoren-9-ylidenedi-4,1-phenylene)bis[1,3-dihydro-1, 3-dioxo-5-isobenzofuran carboxamide] (FDA-ATA). Examples of the aromatic anhydride comprising ester group include p-phenylene bis(trimellitate) dianhydride (TAHQ). Examples of the aromatic anhydride comprising ether group include 4,4'-(4,4'-isopropylidenediphenoxy)bis(phthalic anhydride) (BPADA), 4,4'-oxydiphthalic dianhydride (sODPA), 2,3,3',4'-diphenyl ether tetracarboxylic dianhydride (aODPA), and 4,4'-(4,4'-isopropylidenediphenoxy)bis(phthalic anhydride)(BPADA). Examples of the aromatic anhydride comprising sulfide group include 4,4'-bis(phthalic anhydride)sulfide (TPDA). Examples of the aromatic anhydride comprising sulfonyl group include 3,3',4,4'-diphenylsulfonetetracarboxylic dianhydride (DSDA). Examples of the aromatic anhydride comprising carbonyl group include 3,3',4,4'-benzophenonetetracarboxylic dianhydride (BTDA).

The alicyclic anhydride includes 1,2,4,5-cyclohexanetetracarboxylic acid dianhydride which is referred to as HPMDA, 1,2,3,4-butanetetracarboxylic dianhydride (BDA), tetrahydro-1H-5,9-methanopyrano[3,4-d]oxepine-1,3,6,8(4H)-tetrone (TCA), hexahydro-4,8-ethano-1H,3H-benzo [1,2-C:4,5-C']difuran-1,3,5,7-tetrone (BODA), cyclobutane-1,2,3,4-tetracarboxylic dianhydride(CBDA), and 1,2,3,4-cyclopentanetetracarboxylic dianhydride (CpDA); or alicyclic anhydride comprising an olefin structure, such as bicyclo[2.2.2]oct-7-ene-2,3,5,6-tetracarboxylic dianhydride (COeDA). When an anhydride comprising ethynyl such as 4,4'-(ethyne-1,2-diyl)diphthalic anhydride (EBPA) is used, the mechanical strength of the light-conversion layer can be further ensured by post-curing.

Considering the solubility, 4,4'-oxydiphthalic anhydride (sODPA), 3,3',4,4'-benzophenonetetracarboxylic dianhydride (BTDA), cyclobutanetetracarboxylic dianhydride (CBDA) and 4,4'-(hexafluoroisopropylidene)diphthalic anhydride (6FDA) are preferred. The above dianhydride can be used alone or in combination.

Are is derived from diamine which may be an aromatic diamine or an aliphatic diamine. The aromatic diamine includes an aromatic diamine comprising only a benzene ring, a fluorinated aromatic diamine, an aromatic diamine comprising ester group, an aromatic diamine comprising ether group, an aromatic diamine comprising amido group, an aromatic diamine comprising carbonyl group, an aromatic diamine comprising hydroxyl group, an aromatic diamine comprising carboxy group, an aromatic diamine comprising sulfonyl group, and an aromatic diamine comprising sulfide group.

The aromatic diamine comprising only a benzene ring includes m-phenylenediamine, p-phenylenediamine, 2,4-diaminotoluene, 2,6-diamino-3,5-diethyltoluene, 3,3'-di methylbiphenyl-4,4'-diamine 9,9-bis(4-aminophenyl)fluorene (FDA), 9,9-bis(4-amino-3-methylphenyl)fluorene, 2,2-bis(4-aminophenyl)propane, 2,2-bis(3-methyl-4-aminophenyl)propane, 4,4'-diamino-2,2'-dimethylbiphenyl(APB). The fluorinated aromatic diamine includes 2,2'-bis(trifluoromethyl)benzidine (TFMB), 2,2-bis(4-aminophenyl)hexafluoropropane (6FDAM), 2,2-bis[4-(4-aminophenoxy)phenyl]hexafluoropropane (HFBAPP), and 2,2-bis(3-amino-4-methylphenyl)hexafluoropropane (BIS-AF-AF). The aromatic diamine comprising ester group includes [4-(4-aminobenzoyl)oxyphenyl]4-aminobenzoate (ABHQ), bis(4-aminophenyl)terephthalate(BPTP), and 4-aminophenyl 4-aminobenzoate (APAB). The aromatic diamine comprising ether group includes 2,2-bis[4-(4-aminophenoxy)phenyl]propane(BAPP), 2,2'-bis[4-(4-am inophenoxy)phenyl]propane (ET-BDM), 2,7-bis(4-aminophenoxy)-naphthalene (ET-2,7-Na), 1,3-bis(3-aminophenoxy)benzene (TPE-M), 4,4'[1,4-phenyldi(oxy)]bis[3-(trifluoromethyl)aniline] (p-6FAPB), 4,4'-diaminodiphenyl ether (ODA), 1,3-bis(4-aminophenoxy)benzene (TPE-R), 1,4-bis(4-aminophenoxy)benzene (TPE-Q), and 4,4'-bis(4-aminophenoxy)biphenyl(BAPB). The aromatic diamine comprising amido group includes N,N'-bis(4-aminophenyl)benzene-1,4-dicarboxamide (BPTPA), 3,4'-diamino benzanilide (m-APABA), and 4,4'-diaminobenzanilide (DABA). The aromatic diamine comprising carbonyl group includes 4,4'-diaminobenzophenone (4,4'-DABP), and bis(4-amino-3-carboxyphenyl) methane (or referred to as 6,6'-diamino-3,3'-methylanediyl-dibenzoic acid). The aromatic diamine comprising hydroxyl group includes 3,3'-dihydroxybenzidine (HAB), and 2,2-bis(3-amino-4-hydroxyphenyl)hexafluoropropane (6FAP). The aromatic diamine comprising carboxy group includes κ,6'-diamino-3,3'-methylanediyl-dibenzoic acid (MBAA), and 3,5-diaminobenzoic acid (DBA). The aromatic diamine comprising sulfonyl group includes 3,3'-diaminodiphenyl sulfone (DDS),4,4'-diaminodiphenyl sulfone, bis[4-(4-aminophenoxy)phenyl]sulfone (BAPS) (or referred to as 4,4'-bis(4-aminophenoxy)diphenylsulfone), and 3,3'-diamino-4,4'-dihydroxydiphenyl sulfone (ABPS). The aromatic diamine comprising sulfide group includes 4,4'-diaminodiphenyl sulfide.

The aliphatic diamine is a diamine which does not comprise any aromatic structure (e.g., benzene ring). The aliphatic diamine includes monocyclic alicyclic amine and straight chain aliphatic diamine, wherein the straight chain aliphatic diamine include siloxane diamine, straight chain alkyl diamine and straight chain aliphatic diamine comprising ether group. The monocyclic alicyclic diamine includes 4,4'-diaminod icyclohexylmethane (PACM), and 3,3'-dimethyl-4,4-diaminodicyclohexylmethane (DMDC). The siloxane diamine (or referred to as amino-modified silicone) includes α, ω-(3-aminopropyl)polysiloxane (KF8010), X22-161A, X22-161B, NH15D, and 1,3-bis(3-aminopropyl)-1,1,3,3-tetramethyldisiloxane (PAME). The straight chain alkyl diamine has 6~12 carbon atoms, and is preferably unsubstituted straight chain alkyl diamine. The straight chain aliphatic diamine comprising ether group includes ethylene glycol di(3-aminopropyl) ether.

The diamine can also be a diamine comprising fluorenyl group. The fluorenyl group has a bulky free volume and rigid fused-ring structure, which renders the polyimide good heat resistance, thermal and oxidation stabilities, mechanical properties, optical transparency and good solubility in organic solvents. The diamine comprising fluorenyl group, such as 9,9-bis(3,5-difluoro-4-aminophenyl)fluorene, may be obtained through a reaction between 9-fluorenone and 2,6-dichloroaniline. The fluorinated diamine can be 1,4-bis(3'-amino-5'-trifluoromethylphenoxy)biphenyl, which is a meta-substituted fluorine-containing diamine having a rigid biphenyl structure. The meta-substituted structure can hinder the charge flow along the molecular chain and reduce the intermolecular conjugation, thereby reducing the absorption of visible lights. Using asymmetric diamine or anhydride can increase to some extent the transparency of the organosilicon-modified polyimide resin composition. The above diamines can be used alone or in combination.

Examples of diamines having active hydrogen include diamines comprising hydroxyl group, such as 3,3'-diamino-4,4'-dihydroxybiphenyl, 4,4'-diamino-3,3'-dihydroxy-1,1'-biphenyl (or referred to as 3,3'-dihydroxybenzidine) (HAB), 2,2-bis(3-amino-4-hydroxyphenyl)propane(BAP), 2,2-bis(3-amino-4-hydroxyphenyl)hexafluoropropane(6FAP), 1,3-bis(3-hydro-4-aminophenoxy) benzene, 1,4-bis(3-hydroxy-4-aminophenyl)benzene and 3,3'-diamino-4,4'-dihydroxydiphenyl sulfone (ABPS). Examples of diamines comprising carboxy group include 3,5-diaminobenzoic acid, bis(4-amino-3-carboxyphenyl)methane (or referred to as 6,6'-diamino-3,3'-methylenedibenzoic acid), 3,5-bis(4-aminophenoxy)benzoic acid, and 1,3-bis(4-amino-2-carboxyphenoxy)benzene. Examples of diamines comprising amino group include 4,4'-diam inobenzanilide (DABA), 2-(4-aminophenyl)-5-aminobenzoimidazole, diethylenetriamine, 3,3'-diaminod ipropylamine, triethylenetetramine, and N,N'-bis(3-aminopropyl)ethylenediamine (or referred to as N,N-di(3-aminopropyl)ethylethylamine). Examples of diamines comprising thiol group include 3,4-diaminobenzenethiol. The above diamines can be used alone or in combination.

The organosilicon-modified polyimide can be synthesized by well-known synthesis methods. For example, it can be prepared from a dianhydride and a diamine which are dissolved in an organic solvent and subjected to imidation in the presence of a catalyst. Examples of the catalyst include acetic anhydride/triethylamine, and valerolactone/pyridine. Preferably, removal of water produced in the azeotropic process in the imidation is promoted by using a dehydrant such as toluene.

Polyimide can also be obtained by carrying out an equilibrium reaction to give a poly (amic acid) which is heated to dehydrate. In other embodiments, the polyimide backbone may have a small amount of amic acid. For example, the ratio of amic acid to imide in the polyimide molecule may be 1~3:100. Due to the interaction between amic acid and the epoxy resin, the substrate has superior properties. In other embodiments, a solid state material such as a thermal curing agent, inorganic heat dispersing particles and phosphor can also be added at the state of poly (amic acid) to give the substrate. In addition, solubilized polyimide can also be obtained by direct heating and dehydration after mixing of alicyclic anhydride and diamine. Such solubilized polyimide, as an adhesive material, has a good light transmittance. In addition, it is liquid state; therefore, other solid materials (such as the inorganic heat dispersing particles and the phosphor) can be dispersed in the adhesive material more sufficiently.

In addition, the polyimide compound may be obtained by dehydration and ring-closing and condensation polymerization from an anhydride and a diamine, such as an anhydride and a diamine in a molar ratio of 1:1. In one embodiment, 200 micromole (mmol) of 4,4'-(hexafluoroisopropylidene) diphthalic anhydride(6FDA), 20 micromole (mmol) of 2,2-bis(3-amino-4-hydroxyphenyl)hexafluoropropane(6FAP), 50 micromole (mmol) of 2,2'-di(trifluoromethyl)diaminobiphenyl(TFMB) and 130 micromole (mmol) of aminopropyl-terminated poly(dimethylsiloxane) are used to give the PI synthesis solution.

The above methods can be used to produce amino-terminated polyimide compounds. However, other methods can be used to produce carboxy-terminated polyimide compounds. In addition, in the above reaction between anhydride and diamine, where the backbone of the anhydride comprises a carbon-carbon triple bond, the affinity of the carbon-carbon triple bond can promote the molecular structure. Alternatively, a diamine comprising vinyl siloxane structure can be used.

The molar ratio of dianhydride to diamine may be 1:1. The molar percentage of the diaminecomprising a functional group having active hydrogen may be 5~25% of the total amount of diamine. The temperature under which the polyimide is synthesized is preferably 80~250° C., more preferably 100~200° C. The reaction time may vary depending on the size of the batch. For example, the reaction time for obtaining 10~30 g polyimide is 6~10 hours.

The organosilicon-modified polyimide can be classified as fluorinated aromatic organosilicon-modified polyimides and aliphatic organosilicon-modified polyimides. The fluorinated aromatic organosilicon-modified polyimides are synthesized from siloxane-type diamine, aromatic diamine comprising fluoro (F) group (or referred to as fluorinated aromatic diamine) and aromatic dianhydride comprising fluoro (F) group (or referred to as fluorinated aromatic anhydride). The aliphatic organosilicon-modified polyimides are synthesized from dianhydride, siloxane-type diamine and at least one diamine not comprising aromatic structure (e.g., benzene ring) (or referred to as aliphatic diamine), or from diamine (one of which is siloxane-type diamine) and at least one dianhydride not comprising aromatic structure (e.g., benzene ring) (or referred to as aliphatic anhydride). The aliphatic organosilicon-modified polyimide includes semi-aliphatic organosilicon-modified polyimide and fully aliphatic organosilicon-modified polyimide. The fully aliphatic organosilicon-modified polyimide is synthesized from at least one aliphatic dianhydride, siloxane-type diamine and at least one aliphatic diamine. The raw materials for synthesizing the semi-aliphatic organosilicon-modified polyimide include at least one aliphatic dianhydride or aliphatic diamine. The raw materials required for synthesizing the organosilicon-modified polyimide and the siloxane content in the organosilicon-modified polyimide would have certain effects on transparency, chromism, mechanical property, warpage extent and refractivity of the substrate.

The organosilicon-modified polyimide of the present disclosure has a siloxane content of 20~75 wt %, preferably 30~70 wt %, and a glass transition temperature of below 150° C. The glass transition temperature (Tg) is determined on TMA-60 manufactured by Shimadzu Corporation after adding a thermal curing agent to the organosilicon-modified polyimide. The determination conditions include: load: 5 gram; heating rate: 10° C./min; determination environment: nitrogen atmosphere; nitrogen flow rate: 20 ml/min; temperature range: −40 to 300° C. When the siloxane content is below 20%, the film prepared from the organosilicon-modified polyimide resin composition may become very hard and brittle due to the filling of the phosphor and thermal conductive fillers, and tend to warp after drying and curing, and therefore has a low processability. In addition, its resistance to thermochromism becomes lower. On the other hand, when the siloxane content is above 75%, the film prepared from the organosilicon-modified polyimide resin composition becomes opaque, and has reduced transparency and tensile strength. Here, the siloxane content is the weight ratio of siloxane-type diamine (having a structure shown in Formula (A)) to the organosilicon-modified polyimide, wherein the weight of the organosilicon-modified polyimide is the total weight of the diamine and the dianhydride used for synthesizing the organosilicon-modified polyimide subtracted by the weight of water produced during the synthesis.

Formula (A)

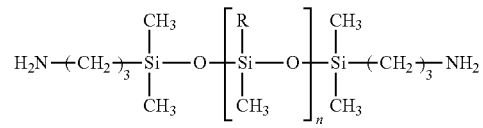

Wherein R is methyl or phenyl, preferably methyl, n is 1~5, preferably 1, 2, 3 or 5.

The only requirements on the organic solvent used for synthesizing the organosilicon-modified polyimide are to dissolve the organosilicon-modified polyimide and to ensure the affinity (wettability) to the phosphor or the fillers to be added. However, excessive residue of the solvent in the product should be avoided. Normally, the number of moles of the solvent is equal to that of water produced by the reaction between diamine and anhydride. For example, 1 mol diamine reacts with 1 mol anhydride to give 1 mol water; then the amount of solvent is 1 mol. In addition, the organic solvent used has a boiling point of above 80° C. and below 300° C., more preferably above 120° C. and below 250° C., under standard atmospheric pressure. Since drying and curing under a lower temperature are needed after coating, if the temperature is lower than 120° C., good coating cannot be achieved due to high drying speed during the coating process. If the boiling point of the organic solvent is higher than 250° C., the drying under a lower temperature may be deferred. Specifically, the organic solvent may be an ether-type organic solvent, an ester-type organic solvent, a dimethyl ether-type organic solvent, a ketone-type organic solvent, an alcohol-type organic solvent, an aromatic hydrocarbon solvent or other solvents. The ether-type organic solvent includes ethylene glycol monomethyl ether, ethylene glycol monoethyl ether, propylene glycol monomethyl ether. The ester-type organic solvent includes acetates, including ethylene glycol monoethyl ether acetate, diethylene glycol monobutyl ether acetate, propylene glycol monomethyl ether acetate, propyl acetate. The dimethyl ether-type solvent includes triethylene glycol dimethyl ether and tetraethylene glycol dimethyl ether. The ketone-type solvent includes acetylacetone, methyl propyl ketone, methyl butyl ketone, methyl isobutyl ketone, cyclopentanone, and 2-heptanone. The alcohol-type solvent includes butanol, isopentanol, 3-methyl-2-butanol, 3-methyl-3-methoxybutanol, and diacetone alcohol. The aromatic hydrocarbon solvent includes toluene and xylene. Other solvents include γ-butyrolactone, N-methylpyrrolidone, N,N-dimethylformamide.

The present disclosure provides an organosilicon-modified polyimide resin composition comprising the above organosilicon-modified polyimide and a thermal curing agent, which may be epoxy resin, hydrogen isocyanate or bisoxazoline compound. In one embodiment, based on the weight of the organosilicon-modified polyimide, the amount of the thermal curing agent is 5~12% of the weight of the organosilicon-modified polyimide. The organosilicon-modified polyimide resin composition may further comprise heat dispersing particles and phosphor.

Light Transmittance

The factors affecting the light transmittance of the organosilicon-modified polyimide resin composition at least include the type of the main material, the type of the modifier (thermal curing agent), the type and content of the heat dispersing particles, and the siloxane content. Light transmittance refers to the transmittance of the light near the main light-emitting wavelength range of the LED chip. For example, blue LED chip has a main light-emitting wavelength of around 450 nm, then the composition or the polyimide should have low enough or even no absorption to the light having a wavelength around 450 nm, so as to ensure that most or even all the light can pass through the composition or the polyimide. In addition, when the light emitted by the LED chip passes through the interface of two materials, the closer the refractive indexes of the two materials, the higher the light output efficiency. In order to be close to the refractive index of the material (such as die bonding glue) contacting with the filament substrate (or base layer), the organosilicon-modified polyimide composition has a refractive index of 1.4~1.7, preferably 1.4~1.55. In order to use the organosilicon-modified polyimide resin composition as substrate in the filament, the organosilicon-modified polyimide resin composition is required to have good light transmittance at the peak wavelength of InGaN of the blue-excited white LED. In order to obtain a good transmittance, the raw materials for synthesizing the organosilicon-modified polyimide, the thermal curing agent and the heat dispersing particles can be adjusted. Because the phosphor in the organosilicon-modified polyimide resin composition may have certain effect on the transmittance test, the organosilicon-modified polyimide resin composition used for the transmittance test does not comprise phosphor. Such an organosilicon-modified polyimide resin composition has a transmittance of 86~93%, preferably 88~91%, or preferably 89~92%, or preferably 90~93%.

In the reaction of anhydride and diamine to produce polyimide, the anhydride and the diamine may vary. In other words, the polyimides produced from different anhydrides and different diamines may have different light transmittances. The aliphatic organosilicon-modified polyimide resin composition comprises the aliphatic organosilicon-modified polyimide and the thermal curing agent, while the fluorinated aromatic organosilicon-modified polyimide resin composition comprises the fluorinated aromatic organosilicon-modified polyimide and the thermal curing agent. Since the aliphatic organosilicon-modified polyimide has an alicyclic structure, the aliphatic organosilicon-modified polyimide resin composition has a relatively high light transmittance. In addition, the fluorinated aromatic, semi-aliphatic and full aliphatic polyimides all have good light transmittance in respect of the blue LED chips. The fluorinated aromatic organosilicon-modified polyimide is synthesized from a siloxane-type diamine, an aromatic diamine comprising a fluoro (F) group (or referred to as fluorinated aromatic diamine) and an aromatic dianhydride comprising a fluoro (F) group (or referred to as fluorinated aromatic anhydride). In other words, both $Ar^1$ and $Ar^2$ comprise a fluoro (F) group. The semi-aliphatic and full aliphatic organosilicon-modified polyimides are synthesized from a dianhydride, a siloxane-type diamine and at least one diamine not comprising an aromatic structure (e.g. a benzene ring) (or referred to as aliphatic diamine), or from a diamine (one of the diamine is siloxane-type diamine) and at least one dianhydride not comprising an aromatic structure (e.g. a benzene ring) (or referred to as aliphatic anhydride). In other words, at least one of $Ar^1$ and $Ar^2$ has an alicyclic hydrocarbon structure.

Although blue LED chips have a main light-emitting wavelength of 450 nm, they may still emit a minor light having a shorter wavelength of around 400 nm, due to the difference in the conditions during the manufacture of the chips and the effect of the environment. The fluorinated aromatic, semi-aliphatic and full aliphatic polyimides have different absorptions to the light having a shorter wavelength of 400 nm. The fluorinated aromatic polyimide has an absorbance of about 20% to the light having a shorter wavelength of around 400 nm, i.e. the light transmittance of the light having a wavelength of 400 nm is about 80% after passing through the fluorinated aromatic polyimide. The semi-aliphatic and full aliphatic polyimides have even lower absorbance to the light having a shorter wavelength of 400 nm than the fluorinated aromatic polyimide, which is only 12%. Accordingly, in an embodiment, if the LED chips used in the LED filament have a uniform quality, and emit less blue light having a shorter wavelength, the fluorinated aromatic organosilicon-modified polyimide may be used to produce the filament substrate or the light-conversion layer. In another embodiment, if the LED chips used in the LED filament have different qualities, and emit more blue light having a shorter wavelength, the semi-aliphatic or full aliphatic organosilicon-modified polyimides may be used to produce the filament substrate or the light-conversion layer.

Adding different thermal curing agents imposes different effects on the light transmittance of the organosilicon-modified polyimide. Table 1-1 shows the effect of the addition of different thermal curing agents on the light transmittance of the full aliphatic organosilicon-modified polyimide. At the main light-emitting wavelength of 450 nm for the blue LED chip, the addition of different thermal curing agents renders no significant difference to the light transmittance of the full aliphatic organosilicon-modified polyimide; while at a short wavelength of 380 nm, the addition of different thermal curing agents does affect the light transmittance of the full aliphatic organosilicon-modified polyimide. The organosilicon-modified polyimide itself has a poorer transmittance to the light having a short wavelength (380 nm) than to the light having a long wavelength (450 nm). However, the extent of the difference varies with the addition of different thermal curing agents. For example, when the thermal curing agent KF105 is added to the full aliphatic organosilicon-modified polyimide, the extent of the reduction in the light transmittance is less. In comparison, when the thermal curing agent 2021p is added to the full aliphatic organosilicon-modified polyimide, the extent of the reduction in the light transmittance is more. Accordingly, in an embodiment, if the LED chips used in the LED filament have a uniform quality, and emit less blue light having a short wavelength, the thermal curing agent BPA or the thermal curing agent 2021p may be added. In comparison, in an embodiment, if the LED chips used in the LED filament have different qualities, and emit more blue light having a short wavelength, the thermal curing agent KF105 may be used. Both Table 1-1 and Table 1-2 show the results obtained in the transmittance test using Shimadzu UV-Vis Spectrometer UV-1800. The light transmittances at wavelengths 380 nm, 410 nm and 450 nm are tested based on the light emission of white LEDs.

TABLE 1-1

| Organo-silicon-Modified Polyimides | Thermal Curing Agent Types | Amount (%) | Light Transmittance (%) 380 nm | 410 nm | 450 nm | Film Thickness (μm) | Mechanical Strength Elongation (%) | Tensile Strength (MPa) |
|---|---|---|---|---|---|---|---|---|
| Full Aliphatic | BPA | 8.0 | 87.1 | 89.1 | 90.6 | 44 | 24.4 | 10.5 |
| Full Aliphatic | X22-163 | 8.0 | 86.6 | 88.6 | 90.2 | 44 | 43.4 | 8.0 |
| Full Aliphatic | KF105 | 8.0 | 87.2 | 88.9 | 90.4 | 44 | 72.6 | 7.1 |
| Full Aliphatic | EHPE3150 | 8.0 | 87.1 | 88.9 | 90.5 | 44 | 40.9 | 13.1 |
| Full Aliphatic | 2021p | 8.0 | 86.1 | 88.1 | 90.1 | 44 | 61.3 | 12.9 |

TABLE 1-2

| Organo-silicon-Modified Polyimide Type | Thermal Curing Agent Amount (%) | Light Transmittance (%) 380 nm | 410 nm | 450 nm | Film Thickness (mm) | Mechanical Strength Elongation (%) | Tensile Strength (MPa) |
|---|---|---|---|---|---|---|---|
| Full Aliphatic | BPA 4.0 | 86.2 | 88.4 | 89.7 | 44 | 22.5 | 9.8 |
| Full Aliphatic | 8.0 | 87.1 | 89.1 | 90.6 | 44 | 24.4 | 10.5 |
| Full Aliphatic | 12.0 | 87.3 | 88.9 | 90.5 | 44 | 20.1 | 9.0 |

Even when the same thermal curing agent is added, different added amount thereof will have different effects on the light transmittance. Table 1-2 shows that when the added amount of the thermal curing agent BPA to the full aliphatic organosilicon-modified polyimide is increased from 4% to 8%, the light transmittance increases. However, when the added amount is further increased to 12%, the light transmittance keeps almost constant. It is shown that the light transmittance increases with the increase of the added amount of the thermal curing agent, but after the light transmittance increases to certain degree, adding more thermal curing agent will have limited effect on the light transmittance.

Different heat dispersing particles would have different transmittances. If heat dispersing particles with low light transmittance or low light reflection are used, the light transmittance of the organosilicon-modified polyimide resin composition will be lower. The heat dispersing particles in the organosilicon-modified polyimide resin composition of the present disclosure are preferably selected to be transparent powders or particles with high light transmittance or high light reflection. Since the soft filament for the LED is mainly for the light emission, the filament substrate should have good light transmittance. In addition, when two or more types of heat dispersing particles are mixed, particles with high light transmittance and those with low light transmittance can be used in combination, wherein the proportion of particles with high light transmittance is higher than that of particles with low light transmittance. In an embodiment, for example, the weight ratio of particles with high light transmittance to particles with low light transmittance is 3~5:1.

Different siloxane content also affects the light transmittance. As can be seen from Table 2, when the siloxane content is only 37 wt %, the light transmittance is only 85%. When the siloxane content is increased to above 45%, the light transmittance exceeds 94%.

TABLE 2

| Organosilicon-Modified Polyimide | Siloxane Content (wt %) | Thermal Curing Agent | Tg (° C.) | Tensile Strength (MPa) | Elastic Modulus (GPa) | Elongation at Break (%) | Transmittance | Chemical Resistance | Resistance to Thermochromism |
|---|---|---|---|---|---|---|---|---|---|
| 1 | 37 | BPA | 158 | 33.2 | 1.7 | 10 | 85 | Δ | 83 |
| 2 | 41 | BPA | 142 | 38.0 | 1.4 | 12 | 92 | ○ | 90 |
| 3 | 45 | BPA | 145 | 24.2 | 1.1 | 15 | 97 | Δ | 90 |
| 4 | 64 | BPA | 30 | 8.9 | 0.04 | 232 | 94 | ○ | 92 |
| 5 | 73 | BPA | 0 | 1.8 | 0.001 | 291 | 96 | ○ | 95 |

Heat Resistance

The factors affecting the heat resistance of the organosilicon-modified polyimide resin composition include at least the type of the main material, the siloxane content, and the type and content of the modifier (thermal curing agent).

All the organosilicon-modified polyimide resin composition synthesized from fluorinated aromatic, semi-aliphatic and, full aliphatic organosilicon-modified polyimide have superior heat resistance, and are suitable for producing the filament substrate or the light-conversion layer. Detailed results from the accelerated heat resistance and aging tests (300° C.×1 hr) show that the fluorinated aromatic organosilicon-modified polyimide has better heat resistance than the aliphatic organosilicon-modified polyimide. Accordingly, in an embodiment, if a high power, high brightness LED chip is used as the LED filament, the fluorinated aromatic organosilicon-modified polyimide may be used to produce the filament substrate or the light-conversion layer.

The siloxane content in the organosilicon-modified polyimide will affect the resistance to thermochromism of the organosilicon-modified polyimide resin composition. The resistance to thermochromism refers to the transmittance determined at 460 nm after placing the sample at 200° C. for 24 hours. As can be seen from Table 2, when the siloxane content is only 37 wt %, the light transmittance after 24 hours at 200° C. is only 83%. As the siloxane content is increased, the light transmittance after 24 hours at 200° C. increases gradually. When the siloxane content is 73 wt %, the light transmittance after 24 hours at 200° C. is still as high as 95%. Accordingly, increasing the siloxane content can effectively increase the resistance to thermochromism of the organosilicon-modified polyimide.

In the cross-linking reaction between the organosilicon-modified polyimide and the thermal curing agent, the thermal curing agent should have an organic group which is capable of reacting with the functional group having active hydrogen in the polyimide. The amount and the type of the thermal curing agent have certain effects on chromism, mechanical property and refractive index of the substrate. Accordingly, a thermal curing agent with good heat resistance and transmittance can be selected. Examples of the thermal curing agent include epoxy resin, isocyanate, bismaleimide, and bisoxazoline compounds. The epoxy resin may be bisphenol A epoxy resin, such as BPA; or siloxane-type epoxy resin, such as KF105, X22-163, and X22-163A; or alicyclic epoxy resin, such as 3,4-epoxycyclohexylmethyl3,4-epoxycyclohexanecarboxylate (2021P), EHPE3150, and EHPE3150CE. Through the bridging reaction by the epoxy resin, a three dimensional bridge structure is formed between the organosilicon-modified polyimide and the epoxy resin, increasing the structural strength of the adhesive itself. In an embodiment, the amount of the thermal curing agent may be determined according to the molar amount of the thermal curing agent reacting with the functional group having active hydrogen in theorganosilicon-modified polyimide. In an embodiment, the molar amount of the functional group having active hydrogen reacting with the thermal curing agent is equal to that of the thermal curing agent. For example, when the molar amount of the functional group having active hydrogen reacting with the thermal curing agent is 1 mol, the molar amount of the thermal curing agent is 1 mol.

Thermal Conductivity

The factors affecting the thermal conductivity of the organosilicon-modified polyimide resin composition include at least the type and content of the phosphor, the type and content of the heat dispersing particles and the addition and the type of the coupling agent. In addition, the particle size and the particle size distribution of the heat dispersing particles would also affect the thermal conductivity.

The organosilicon-modified polyimide resin composition may also comprise phosphor for obtaining the desired light-emitting properties. The phosphor can convert the wavelength of the light emitted from the light-emitting semiconductor. For example, yellow phosphor can convert blue light to yellow light, and red phosphor can convert blue light to red light. Examples of yellow phosphor include transparent phosphor such as $(Ba,Sr,Ca)_2SiO_4:Eu$, and $(Sr,Ba)_2 SiO_4$: Eu(barium orthosilicate (BOS)); silicate-type phosphor having a silicate structure such as $Y_3Al_5O_{12}:Ce$(YAG (yttrium•aluminum•garnet):Ce), and $Tb_3Al_3O_{12}:Ce$(YAG (terbium•aluminum•garnet):Ce); and oxynitride phosphor such as Ca-α-SiAlON. Examples of red phosphor include nitride phosphor, such as $CaAlSiN_3:Eu$, and $CaSiN_2:Eu$. Examples of green phosphor include rare earth-halide phosphor, and silicate phosphor. The ratio of the phosphor in the organosilicon-modified polyimide resin composition may be determined arbitrarily according to the desired light-emitting property. In addition, since the phosphor have a thermal conductivity which is significantly higher than that of the organosilicon-modified polyimide resin, the thermal conductivity of the organosilicon-modified polyimide resin composition as a whole will increase as the ratio of the phosphor in the organosilicon-modified polyimide resin composition increases. Accordingly, in an embodiment, as long as the light-emitting property is fulfilled, the content of the phosphor can be suitably increased to increase the thermal conductivity of the organosilicon-modified polyimide resin composition, which is beneficial to the heat dissipation of the filament substrate or the light-conversion layer. Furthermore, when the organosilicon-modified polyimide resin composition is used as the filament substrate, the content, shape and particle size of the phosphor in the organosilicon-modified polyimide resin composition also have certain effect on the mechanical property (such as the elastic modulus, elongation, tensile strength) and the warpage extent of the substrate. In order to render superior mechanical property and thermal conductivity as well as small warpage extent to the substrate, the phosphor included in the organosilicon-modified polyimide resin composition are particulate, and the shape thereof may be sphere, plate or needle, preferably sphere. The maximum average length of the phosphor (the average particle size when they are spherical) is above 0.1 μm, preferably over 1 μm, further preferably 1~100 μm, and more preferably 1~50 μm. The content of phosphor is no less than 0.05 times, preferably no less than 0.1 times, and no more than 8 times, preferably no more than 7 times, the weight of the organosilicon-modified polyimide. For example, when the weight of the organosilicon-modified polyimide is 100 parts in weight, the content of the phosphor is no less than 5 parts in weight, preferably no less than 10 parts in weight, and no more than 800 parts in weight, preferably no more than 700 parts in weight. When the content of the phosphor in the organosilicon-modified polyimide resin composition exceeds 800 parts in weight, the mechanical property of the organosilicon-modified polyimide resin composition may not achieve the strength as required for a filament substrate, resulting in the increase of the defective rate of the product. In an embodiment, two kinds of phosphor are added at the same time. For example, when red phosphor and green phosphor are added at the same time, the added ratio of red phosphor to green phosphor is 1:5~8, preferably 1:6~7. In another embodiment, red phosphor and yellow phosphor are added at the same time, wherein the added ratio of red phosphor to yellow phosphor is 1:5~8, preferably 1:6~7. In another embodiment, three or more kinds of phosphor are added at the same time.

The main purposes of adding the heat dispersing particles are to increase the thermal conductivity of the organosilicon-modified polyimide resin composition, to maintain the color temperature of the light emission of the LED chip, and to prolong the service life of the LED chip. Examples of the heat dispersing particles include silica, alumina, magnesia, magnesium carbonate, aluminum nitride, boron nitride and diamond. Considering the dispersity, silica, alumina or the combination thereof are some preferable choices. The shape of the heat dispersing particles may be sphere, block, etc., where the sphere shape encompasses shapes which are similar to sphere. In an embodiment, heat dispersing particles may be in a shape of sphere or non-sphere, to ensure the dispersity of the heat dispersing particles and the thermal conductivity of the substrate, wherein the added weight ratio of the spherical and non-spherical heat dispersing particles is 1:0.15~0.35.

Table 3-1 shows the relationship between the content of the heat dispersing particles and the thermal conductivity of the organosilicon-modified polyimide resin composition. As the content of the heat dispersing particles increases, the thermal conductivity of the organosilicon-modified polyimide resin composition increases. However, when the content of the heat dispersing particles in the organosilicon-modified polyimide resin composition exceeds 1200 parts in weight, the mechanical property of the organosilicon-modified polyimide resin composition may not achieve the strength as required for a filament substrate, resulting in the increase of the defective rate of the product. In an embodiment, high content of heat dispersing particles with high light transmittance or high reflectivity (such as $SiO_2$, $Al_2O_3$) may be added, which, in addition to maintaining the transmittance of the organosilicon-modified polyimide resin composition, increases the heat dissipation of the organosilicon-modified polyimide resin composition. The heat conductivities shown in Tables 3-1 and 3-2 were measured by a thermal conductivity meter DRL-III manufactured by Xiangtan city instruments Co., Ltd. under the following test conditions: heating temperature: 90° C.; cooling temperature: 20° C.; load: 350N, after cutting the resultant organosilicon-modified polyimide resin composition into test pieces having a film thickness of 300 μm and a diameter of 30 mm.

TABLE 3-1

| Weight Ratio [wt %] | 0.0% | 37.9% | 59.8% | 69.8% | 77.6% | 83.9% | 89.0% |
|---|---|---|---|---|---|---|---|
| Volume Ratio [vol %] | 0.0% | 15.0% | 30.0% | 40.0% | 50.0% | 60.0% | 70.0% |
| Thermal Conductivity[W/m*K] | 0.17 | 0.20 | 0.38 | 0.54 | 0.61 | 0.74 | 0.81 |

TABLE 3-2

| Specification | 1 | 2 | 3 | 4 | 5 | 6 | 7 |
|---|---|---|---|---|---|---|---|
| Average Particle Size[μm] | 2.7 | 6.6 | 9.0 | 9.6 | 13 | 4.1 | 12 |
| Particle Size Distribution[μm] | 1~7 | 1~20 | 1~30 | 0.2~30 | 0.2~110 | 0.1~20 | 0.1~100 |
| Thermal Conductivity[W/m*K] | 1.65 | 1.48 | 1.52 | 1.86 | 1.68 | 1.87 | 2.10 |

Figure 4:
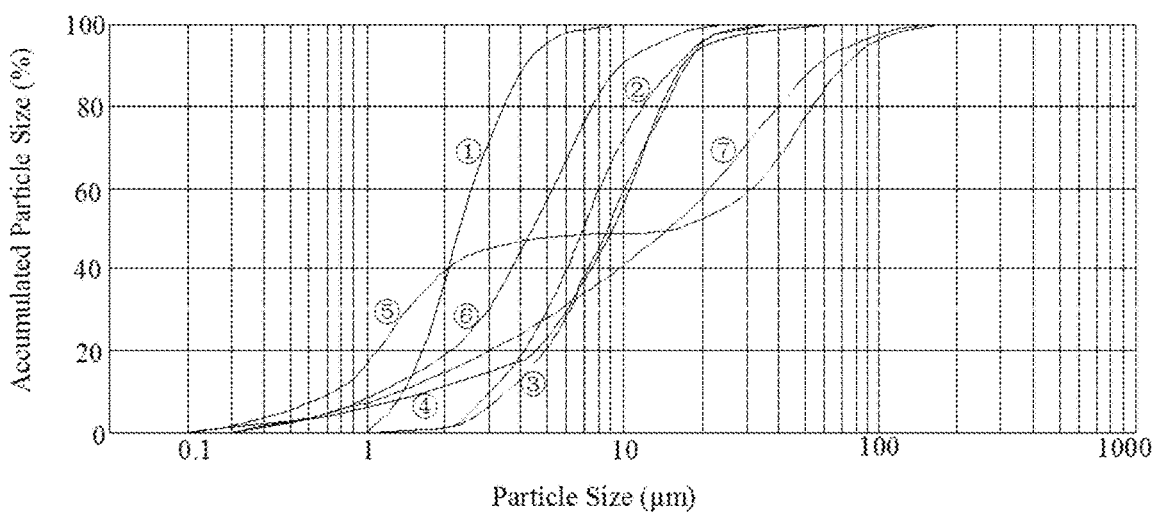
FIG. 4 shows the particle size distributions of the heat dispersing particles with different specifications.

For the effects of the particle size and the particle size distribution of the heat dispersing particles on the thermal conductivity of the organosilicon-modified polyimide resin composition, see both Table 3-2 and FIG. 4. Table 3-2 and FIG. 4 show seven heat dispersing particles with different specifications added into the organosilicon-modified polyimide resin composition in the same ratio and their effects on the thermal conductivity. The particle size of the heat dispersing particles suitable to be added to the organosilicon-modified polyimide resin composition can be roughly classified as small particle size (less than 1 μm), medium particle size (1-30 μm) and large particle size (above 30 μm).

Comparing specifications 1, 2 and 3, wherein only heat dispersing particles with medium particle size but different average particle sizes are added, when only heat dispersing particles with medium particle size are added, the average particle size of the heat dispersing particles does not significantly affect the thermal conductivity of the organosilicon-modified polyimide resin composition. Comparing specifications 3 and 4, wherein the average particle sizes are similar, the specification 4 comprising small particle size and medium particle size obviously exhibits higher thermal conductivity than specification 3 comprising only medium particle size. Comparing specifications 4 and 6, which comprise heat dispersing particles with both small particle size and medium particle size, although the average particle sizes of the heat dispersing particles are different, they have no significant effect on the thermal conductivity of the organosilicon-modified polyimide resin composition. Comparing specifications 4 and 7, specification 7, which comprises heat dispersing particles with large particle size in addition to small particle size and medium particle size, exhibits the most excellent thermal conductivity. Comparing specifications 5 and 7, which both comprise heat dispersing particles with large, medium and small particle sizes and have similar average particle sizes, the thermal conductivity of specification 7 is significantly superior to that of specification 5 due to the difference in the particle size distribution. See FIG. 4 for the particle size distribution of specification 7, the curve is smooth, and the difference in the slope is small, showing that specification 7 not only comprises each particle size, but also have moderate proportions of each particle size, and the particle size is normally distributed. For example, the small particle size represents about 10%, the medium particle size represents about 60%, and the large particle size represents about 30%. In contrast, the curve for specification 5 has two regions with large slopes, which locate in the region of particle size 1-2 μm and particle size 30-70 μm, respectively, indicating that most of the particle size in specification 5 is distributed in particle size 1-2 μm and particle size 30-70 μm, and only small amount of heat dispersing particles with particle size 3-20 μm are present, i.e. exhibiting a two-sided distribution.

Accordingly, the extent of the particle size distribution of the heat dispersing particles affecting the thermal conductivity is greater than that of the average particle size of the heat dispersing particles. When large, medium and small particle sizes of the heat dispersing particles are added, and the small particle size represents about 5-20%, the medium particle size represents about 50-70%, and large particle size represents about 20-40%, the organosilicon-modified polyimide resin will have optimum thermal conductivity. That is because when large, medium and small particle sizes are present, there would be denser packing and contacting each other of heat dispersing particles in a same volume, so as to form an effective heat dissipating route.

In an embodiment, for example, alumina with a particle size distribution of 0.1~100 μm and an average particle size of 12 μm or with a particle size distribution of 0.1~20 μm and an average particle size of 4.1 μm is used, wherein the particle size distribution is the range of the particle size of alumina. In another embodiment, considering the smoothness of the substrate, the average particle size may be selected as 1/5~2/5, preferably 1/5~1/3 of the thickness of the substrate. The amount of the heat dispersing particles may be 1~12 times the weight (amount) of the organosilicon-modified polyimide. For example, if the amount of the organosilicon-modified polyimide is 100 parts in weight, the amount of the heat dispersing particles may be 100~1200 parts in weight, preferably 400~900 parts in weight. Two different heat dispersing particles such as silica and alumina may be added at the same time, wherein the weight ratio of alumina to silica may be 0.4~25:1, preferably 1~10:1.

In the synthesis of the organosilicon-modified polyimide resin composition, a coupling agent such as a silicone coupling agent may be added to improve the adhesion between the solid material (such as the phosphor and/or the heat dispersing particles) and the adhesive material (such as the organosilicon-modified polyimide), and to improve the dispersion uniformity of the whole solid materials, and to further improve the heat dissipation and the mechanical strength of the light-conversion layer. The coupling agent may also be titanate coupling agent, preferably epoxy titanate coupling agent. The amount of the coupling agent is related to the amount of the heat dispersing particles and the specific surface area thereof. The amount of the coupling agent=(the amount of the heat dispersing particles*the specific surface area of the heat dispersing particles)/the minimum coating area of the coupling agent. For example, when an epoxy titanate coupling agent is used, the amount of the coupling agent=(the amount of the heat dispersing particles*the specific surface area of the heat dispersing particles)/331.5.

In other specific embodiments of the present invention, in order to further improve the properties of the organosilicon-modified polyimide resin composition in the synthesis process, an additive such as a defoaming agent, a leveling agent or an adhesive may be selectively added in the process of synthesizing the organosilicon-modified polyimide resin composition, as long as it does not affect light resistance, mechanical strength, heat resistance and chromism of the product. The defoaming agent is used to eliminate the foams produced in printing, coating and curing. For example, acrylic acid or silicone surfactants may be used as the defoaming agent. The leveling agent is used to eliminate the bumps in the film surface produced in printing and coating. Specifically, adding preferably 0.01~2 wt % of a surfactant component can inhibit foams. The coating film can be smoothened by using acrylic acid or silicone leveling agents, preferably non-ionic surfactants free of ionic impurities. Examples of the adhesive include imidazole compounds, thiazole compounds, triazole compounds, organoaluminum compounds, organotitanium compounds and silane coupling agents. Preferably, the amount of these additives is no more than 10% of the weight of the organosilicon-modified polyimide. When the mixed amount of the additive exceeds 10 wt %, the physical properties of the resultant coating film tend to decline, and it even leads to deterioration of the light resistance due to the presence of the volatile components.

Mechanical Strength

The factors affecting the mechanical strength of the organosilicon-modified polyimide resin composition include at least the type of the main material, the siloxane content, the type of the modifier (thermal curing agent), the phosphor and the content of the heat dispersing particles.

Different organosilicon-modified polyimide resins have different properties. Table 4 lists the main properties of the fluorinated aromatic, semi-aliphatic and full aliphatic organosilicon-modified polyimide, respectively, with a siloxane content of about 45% (wt %). The fluorinated aromatic has the best resistance to thermo chromism. The full aliphatic has the best light transmittance. The fluorinated aromatic has both high tensile strength and high elastic modulus. The conditions for testing the mechanical strengths shown in Table 4~6: the organosilicon-modified polyimide resin composition has a thickness of 50 μm and a width of 10 mm, and the tensile strength of the film is determined according to ISO527-3:1995 standard with a drawing speed of 10 mm/min.

TABLE 4

| Organosilicon-Modified Polyimide | Siloxane Content (wt %) | Thermal Curing Agent | Tensile Strength (MPa) | Elastic Modulus (GPa) | Elongation at Break (%) | Transmittance | Resistance to Thermochromism |
|---|---|---|---|---|---|---|---|
| Fluorinated Aromatic | 44 | X22-163 | 22.4 | 1.0 | 83 | 96 | 95 |
| Semi-Aliphatic | 44 | X22-163 | 20.4 | 0.9 | 30 | 96 | 91 |
| Full Aliphatic | 47 | X22-163 | 19.8 | 0.8 | 14 | 98 | 88 |

TABLE 5

| Siloxane Content (wt %) | Addition of Phosphor, Alumina | Thermal Curing Agent | Tg (° C.) | Tensile Strength (MPa) | Elastic Modulus (GPa) | Elongation at Break (%) | Trans-mittance | Chemical Resistance | Resistance to Thermochromism |
|---|---|---|---|---|---|---|---|---|---|
| 37 | × | BPA | 158 | 33.2 | 1.7 | 10 | 85 | Δ | 83 |
| 37 | ○ | BPA | — | 26.3 | 5.1 | 0.7 | — | — | — |
| 41 | × | BPA | 142 | 38.0 | 1.4 | 12 | 92 | ○ | 90 |
| 41 | ○ | BPA | — | 19.8 | 4.8 | 0.8 | — | — | — |
| 45 | × | BPA | 145 | 24.2 | 1.1 | 15 | 97 | Δ | 90 |
| 45 | ○ | BPA | — | 21.5 | 4.2 | 0.9 | — | — | — |
| 64 | × | BPA | 30 | 8.9 | 0.04 | 232 | 94 | ○ | 92 |
| 64 | ○ | BPA | — | 12.3 | 3.1 | 1.6 | — | — | — |
| 73 | × | BPA | 0 | 1.8 | 0.001 | 291 | 96 | ○ | 95 |
| 73 | ○ | BPA | — | 9.6 | 2.5 | 2 | — | — | — |

TABLE 6

| Organo-silicon-Modified Polyimide | Thermal Curing Agent | | Light Transmittance (%) | | | Mechanical Strength | |
|---|---|---|---|---|---|---|---|
| | Type | Amount (%) | 380 nm | 410 nm | 450 nm | Film Thickness (μm) | Elongation (%) | Tensile Strength (MPa) |
| Full Aliphatic | BPA | 8.0 | 87.1 | 89.1 | 90.6 | 44 | 24.4 | 10.5 |
| Full Aliphatic | X22-163 | 8.0 | 86.6 | 88.6 | 90.2 | 40 | 43.4 | 8.0 |
| Full Aliphatic | KF105 | 12.0 | 87.5 | 89.2 | 90.8 | 43 | 80.8 | 7.5 |
| Full Aliphatic | EHPE3150 | 7.5 | 87.1 | 88.9 | 90.5 | 44 | 40.9 | 13.1 |
| Full Aliphatic | 2021p | 5.5 | 86.1 | 88.1 | 90.1 | 44 | 64.0 | 12.5 |

In the manufacture of the filament, the LED chip and the electrodes are first fixed on the filament substrate formed by the organosilicon-modified polyimide resin composition with a die bonding glue, followed by a wiring procedure, in which electric connections are established between adjacent LED chips and between the LED chip and the electrode with wires. To ensure the quality of die bonding and wiring, and to improve the product quality, the filament substrate should have a certain level of elastic modulus to resist the pressing force in the die bonding and wiring processes. Accordingly, the filament substrate should have an elastic modulus more than 2.0 GPa, preferably 2~6 GPa, more preferably 4~6 GPa. Table 5 shows the effects of different siloxane contents and the presence of particles (phosphor and alumina) on the elastic modulus of the organosilicon-modified polyimide resin composition. Where no fluorescent powder or alumina particle is added, the elastic modulus of the organosilicon-modified polyimide resin composition is always less than 2.0 GPa, and as the siloxane content increases, the elastic modulus tends to decline, i.e. the organosilicon-modified polyimide resin composition tends to soften. However, where phosphor and alumina particles are added, the elastic modulus of the organosilicon-modified polyimide resin composition may be significantly increased, and is always higher than 2.0 GPa. Accordingly, the increase in the siloxane content may lead to softening of the organosilicon-modified polyimide resin composition, which is advantageous for adding more fillers, such as more phosphor or heat dispersing particles. In order for the substrate to have superior elastic modulus and thermal conductivity, appropriate particle size distribution and mixing ratio may be selected so that the average particle size is within the range from 0.1 μm to 100 μm or from 1 μm to 50 μm.

In order for the LED filament to have good bending properties, the filament substrate should have an elongation at break of more than 0.5%, preferably 1~5%, most preferably 1.5~5%. As shown in Table 5, where no fluorescent powder or alumina particle is added, the organosilicon-modified polyimide resin composition has excellent elongation at break, and as the siloxane content increases, the elongation at break increases and the elastic modulus decreases, thereby reducing the occurrence of warpage. In contrast, where phosphor and alumina particles are added, the organosilicon-modified polyimide resin composition exhibits decreased elongation at break and increased elastic modulus, thereby increasing the occurrence of warpage.

By adding a thermal curing agent, not only the heat resistance and the glass transition temperature of the organosilicon-modified polyimide resin are increased, the mechanical properties, such as tensile strength, elastic modulus and elongation at break, of the organosilicon-modified polyimide are also increased. Adding different thermal curing agents may lead to different levels of improvement. Table 6 shows the tensile strength and the elongation at break of the organosilicon-modified polyimide resin composition after the addition of different thermal curing agents. For the full aliphatic organosilicon-modified polyimide, the addition of the thermal curing agent EHPE3150 leads to good tensile strength, while the addition of the thermal curing agent KF105 leads to good elongation.

TABLE 7

Specific Information of BPA

| Product Name | Viscosity at 25° C. (mPa · s) | Color (G) | Content of Hydrolysable Chlorine (mg/kg) | Equivalent of Epoxy (g/mol) | Hue APHA |
|---|---|---|---|---|---|
| BPA | 11000~15000 | ≤1 | ≤300 | 184~194 | ≤30 |

TABLE 8

Specific Information of 2021P

| Product Name | Viscosity at 25° C.(mPa.s) | Specific Gravity (25/25° C.) | Melting Point (° C.) | Boiling Point (° C./4hPa) | Water Content (%) | Equivalent of Epoxy(g/mol) | Hue APHA |
|---|---|---|---|---|---|---|---|
| 2021P | 250 | 1.17 | −20 | 188 | 0.01 | 130 | 10 |

TABLE 9

Specific Information of EHPE3150 and EHPE3150CE

| Product Name | Viscosity at 25° C. (mPa · s) | Appearance | Softening Point | Equivalent of Epoxy (g/mol) | Hue APHA |
|---|---|---|---|---|---|
| EHPE3150 | — | Transparent Plate Solid | 75 | 177 | 20 (in 25% acetone solution) |
| EHPE3150CE | 50,000 | Light Yellow Transparent Liquid | — | 151 | 60 |

TABLE 10

Specific Information of PAME, KF8010, X22-161A, X22-161B, NH15D, X22-163, X22-163A and KF-105

| Product Name | Viscosity at 25° C. (mm2/s) | Specific Gravity at 25° C. | Refractive Index at 25° C. | Equivalent of Functional Group |
|---|---|---|---|---|
| PAME | 4 | 0.90 | 1.448 | 130 g/mol |
| KF8010 | 12 | 1.00 | 1.418 | 430 g/mol |
| X22-161A | 25 | 0.97 | 1.411 | 800 g/mol |
| X22-161B | 55 | 0.97 | 1.408 | 1500 g/mol |
| NH15D | 13 | 0.95 | 1.403 | 1.6-2.1 g/mmol |
| X22-163 | 15 | 1.00 | 1.450 | 200 g/mol |
| X22-163A | 30 | 0.98 | 1.413 | 1000 g/mol |
| KF-105 | 15 | 0.99 | 1.422 | 490 g/mol |

The organosilicon-modified polyimide resin composition of the present embodiment may be used in a form of film or as a substrate together with a support to which it adheres. The film forming process comprises three steps: (a) coating step: spreading the above organosilicon-modified polyimide resin composition on a peelable body by coating to form a film; (b) heating and drying step: heating and drying the film together with the peelable body to remove the solvent from the film; and (c) peeling step: peeling the film from the peelable body after the drying is completed to give the organosilicon-modified polyimide resin composition in a form of film. The above peelable body may be a centrifugal film or other materials which do not undergo chemical reaction with the organosilicon-modified polyimide resin composition, e.g., PET centrifugal film.

The organosilicon-modified polyimide resin composition may be adhered to a support to give an assembly film, which may be used as the substrate. The process of forming the assembly film comprises two steps: (a) coating step: spreading the above organosilicon-modified polyimide resin composition on a support by coating to from an assembly film; and (b) heating and drying step: heating and drying the assembly film to remove the solvent from the film.

In the coating step, roll-to-roll coating devices such as roller coater, mold coating machine and blade coating machine, or simple coating means such as printing, inkjeting, dispensing and spraying may be used.

The drying method in the above heating and drying step may be drying in vacuum, drying by heating, or the like. The heating may be achieved by a heat source such as an electric heater or a heating media to produce heat energy and indirect convection, or by infrared heat radiation emitted from a heat source.

A film (composite film) with high thermal conductivity can be obtained from the above organosilicon-modified polyimide resin composition by coating and then drying and curing, so as to achieve any one or combination of the following properties: superior light transmittance, chemical resistance, heat resistance, thermal conductivity, film mechanical property and light resistance. The temperature and time in the drying and curing step may be suitably selected according to the solvent and the coated film thickness of the organosilicon-modified polyimide resin composition. The weight change of the organosilicon-modified polyimide resin composition before and after the drying and curing as well as the change in the peaks in the IR spectrum representing the functional groups in the thermal curing agent can be used to determine whether the drying and curing are completed. For example, when an epoxy resin is used as the thermal curing agent, whether the difference in the weight of the organosilicon-modified polyimide resin composition before and after the drying and curing is equal to the weight of the added solvent as well as the increase or decrease of the epoxy peak before and after the drying and curing are used to determine whether the drying and curing are completed.

Figure 5A:
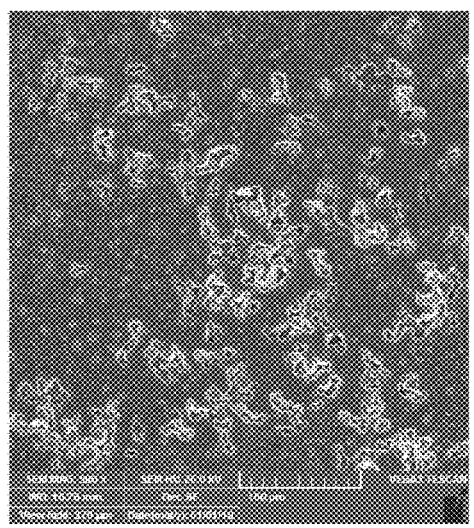
FIG. 5A shows the SEM image of an organosilicon-modified polyimide resin composition composite film (substrate)
Figure 5B:
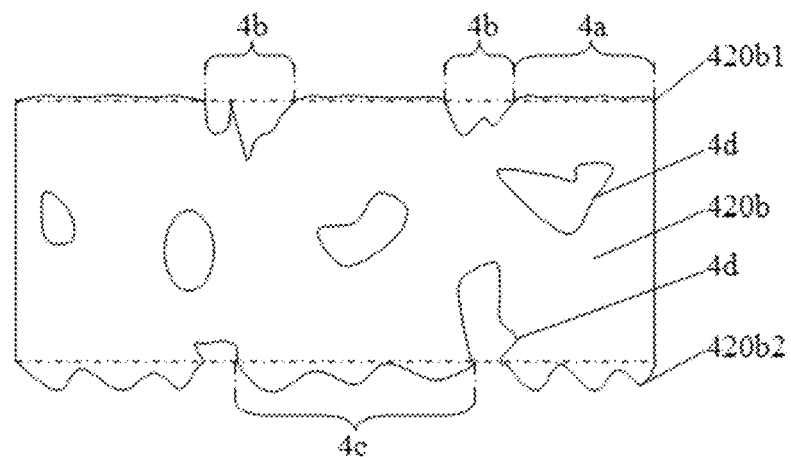
FIG. 5B shows the cross-sectional scheme of an organosilicon-modified polyimide resin composition composite film (substrate) according to an embodiment of the present invention.
Figure 5C:
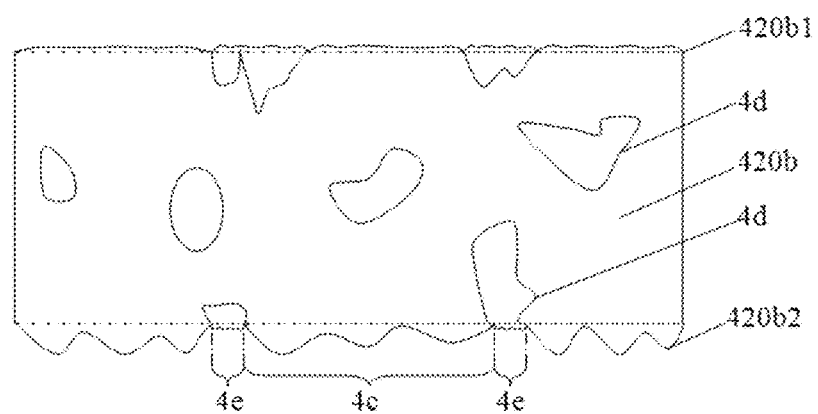
FIG. 5C shows the cross-sectional scheme of an organosilicon-modified polyimide resin composition composite film (substrate) according to another embodiment of the present disclosure.

In an embodiment, the amidation is carried out in a nitrogen atmosphere, or vacuum defoaming is employed in the synthesis of the organosilicon-modified polyimide resin composition, or both, so that the volume percentage of the cells in the organosilicon-modified polyimide resin composition composite film is 5~20%, preferably 5~10%. As shown in FIG. 5B, the organosilicon-modified polyimide resin composition composite film is used as the substrate for the LED soft filament. The substrate 420b has an upper surface 420b1 and an opposite lower surface 420b2. FIG. 5A shows the surface morphology of the substrate after gold is scattered on the surface thereof as observed with vega3 electron microscope from Tescan Corporation. As can be seen from FIG. 5B and the SEM image of the substrate surface shown in FIG. 5A, there is a cell 4d in the substrate, wherein the cell 4d represents 5~20% by volume, preferably 5~10% by volume, of the substrate 420b, and the cross section of the cell 4d is irregular. FIG. 5B shows the cross-sectional scheme of the substrate 420b, wherein the dotted line is the baseline. The upper surface 420b1 of the substrate comprises a first area 4a and a second area 4b, wherein the second area 4b comprises a cell 4d, and the first area 4a has a surface roughness which is less than that of the second area 4b. The light emitted by the LED chip passes through the cell in the second area and is scattered, so that the light emission is more uniform. The lower surface 420b of the substrate comprises a third area 4c, which has a surface roughness which is higher than that of the first area 4a. When the LED chip is positioned in the first area 4a, the smoothness of the first area 4a is favorable for subsequent bonding and wiring. When the LED chip is positioned in the second area 4b or the third area 4c, the area of contact between the die bonding glue and substrate is large, which improves the bonding strength between the die bonding glue and substrate. Therefore, by positioning the LED chip on the upper surface 420b1, bonding and wiring as well as the bonding strength between the die bonding glue and substrate can be ensured at the same time. When the organosilicon-modified polyimide resin composition is used as the substrate of the LED soft filament, the light emitted by the LED chip is scattered by the cell in the substrate, so that the light emission is more uniform, and glare can be further improved at the same time. In an embodiment, the surface of the substrate 420b may be treated with a silicone resin or a titanate coupling agent, preferably a silicone resin comprising methanol or a titanate coupling agent comprising methanol, or a silicone resin comprising isopropanol. The cross section of the treated substrate is shown in FIG. 5C. The upper surface 420b1 of the substrate has relatively uniform surface roughness. The lower surface 420b2 of the substrate comprises a third area 4c and a fourth area 4e, wherein the third area 4c has a surface roughness which is higher than that of the fourth area 4e. The surface roughness of the upper surface 420b1 of the substrate may be equal to that of the fourth area 4e. The surface of the substrate 420b may be treated so that a material with a high reactivity and a high strength can partially enter the cell 4d, so as to improve the strength of the substrate.

When the organosilicon-modified polyimide resin composition is prepared by vacuum defoaming, the vacuum used in the vacuum defoaming may be −0.5~−0.09 MPa, preferably −0.2~−0.09 MPa. When the total weight of the raw materials used in the preparation of the organosilicon-modified polyimide resin composition is less than or equal to 250 g, the revolution speed is 1200~2000 rpm, the rotation speed is 1200~2000 rpm, and time for vacuum defoaming is 3~8 min. This not only maintains certain amount of cells in the film to improve the uniformity of light emission, but also keeps good mechanical properties. The vacuum may be suitably adjusted according to the total weight of the raw materials used in the preparation of the organosilicon-modified polyimide resin composition. Normally, when the total weight is higher, the vacuum may be reduced, while the stirring time and the stirring speed may be suitably increased.

According to the present disclosure, a resin having superior transmittance, chemical resistance, resistance to thermochromism, thermal conductivity, film mechanical property and light resistance as required for a LED soft filament substrate can be obtained. In addition, a resin film having a high thermal conductivity can be formed by simple coating methods such as printing, inkjeting, and dispensing.

When the organosilicon-modified polyimide resin composition composite film is used as the filament substrate (or base layer), the LED chip is a hexahedral luminous body. In the production of the LED filament, at least two sides of the LED chip are coated by a top layer. When the prior art LED filament is lit up, non-uniform color temperatures in the top layer and the base layer would occur, or the base layer would give a granular sense. Accordingly, as a filament substrate, the composite film is required to have superior transparency. In other embodiments, sulfonyl group, non-coplanar structure, meta-substituted diamine, or the like may be introduced into the backbone of the organosilicon-modified polyimide to improve the transparency of the organosilicon-modified polyimide resin composition. In addition, in order for the bulb employing said filament to achieve omnidirectional illumination, the composite film as the substrate should have certain flexibility. Therefore, flexible structures such as ether (such as (4,4'-bis(4-amino-2-trifluoromethylphenoxy)diphenyl ether), carbonyl, methylene may be introduced into the backbone of the organosilicon-modified polyimide. In other embodiments, a diamine or dianhydride comprising a pyridine ring may be employed, in which the rigid structure of the pyridine ring can improve the mechanical properties of the composite film. Meanwhile, by using it together with a strong polar group such as —F, the composite film may have superior light transmittance. Examples of the anhydride comprising a pyridine ring include 2,6-bis(3',4'-dicarboxyphenyl)-4-(3",5"-bistrifluoromethylphenyl)pyridine dianhydride.

The LED filament structure in the aforementioned embodiments is mainly applicable to the LED light bulb product, so that the LED light bulb can achieve the omnidirectional light illuminating effect through the flexible bending characteristics of the single LED filament. The specific embodiment in which the aforementioned LED filament applied to the LED light bulb is further explained below.

Figure 6A:
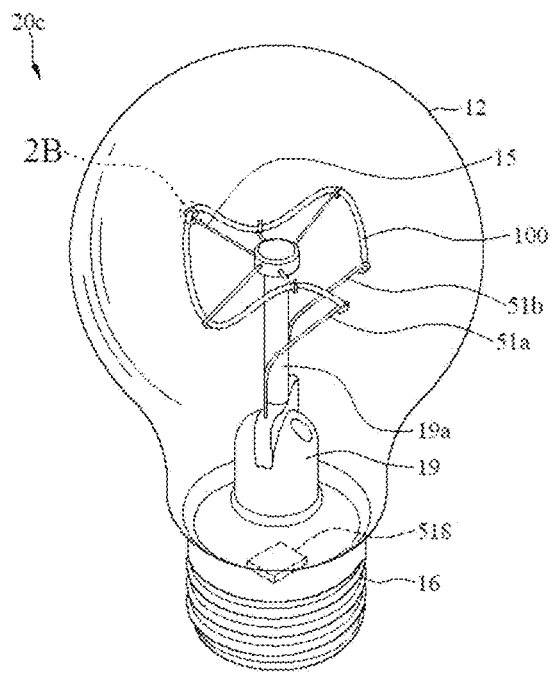
FIG. 6A illustrates a perspective view of an LED light bulb according to the third embodiment of the instant disclosure.

Please refer to FIG. 6A. FIG. 6A illustrates a perspective view of an LED light bulb according to an embodiment of the present disclosure. According to the embodiment, the LED light bulb 20c comprises a lamp housing 12, a bulb base 16 connected with the lamp housing 12, two conductive supports 51a, 51b disposed in the lamp housing 12, a driving circuit 518 electrically connected with both the conductive supports 51a, 51b and the bulb base 16, a stem 19, supporting arms 15 and a single LED filament 100.

The lamp housing 12 is a material which is preferably light transmissive or thermally conductive, such as, glass or plastic, but not limited thereto. In implementation, the lamp housing 12 may be doped with a golden yellow material or its surface coated with a yellow film to absorb a portion of the blue light emitted by the LED chip to reduce the color temperature of the light emitted by the LED light bulb 20c. In other embodiments of the present invention, the lamp housing 12 includes a layer of luminescent material (not shown), which may be formed on the inner surface or the outer surface of the lamp housing 12 according to design requirements or process feasibility, or even integrated in the material of the lamp housing 12. The luminescent material layer comprises low reabsorption semiconductor nanocrystals (hereinafter referred to as quantum dots), the quantum dots comprises a core, a protective shell and a light absorbing shell, and the light absorbing shell is disposed between the core and the protective shell. The core emits the emissive light with emission wavelength, and the light absorbing shell emits the excited light with excitation wavelength. The emission wavelength is longer than the excitation wavelength, and the protective shell provides the stability of the light.

The LED filament 100 shown in FIG. 6A is bent to form a contour resembling to a circle while being observed from the top view of FIG. 6A. According to the embodiment of FIG. 6A, the LED filament 100 is bent to form a wave shape from side view. The shape of the LED filament 100 is novel and makes the illumination more uniform. In comparison with a LED bulb having multiple LED filaments, single LED filament 100 has less connecting spots. In implementation, single LED filament 100 has only two connecting spots such that the probability of defect soldering or defect mechanical pressing is decreased.

The stem 19 has a stand 19a extending to the center of the lamp housing 12. The stand 19a supports the supporting arms 15. The first end of each of the supporting arms 15 is connected with the stand 19a while the second end of each of the supporting arms 15 is connected with the LED filament 100.

Figure 6B:
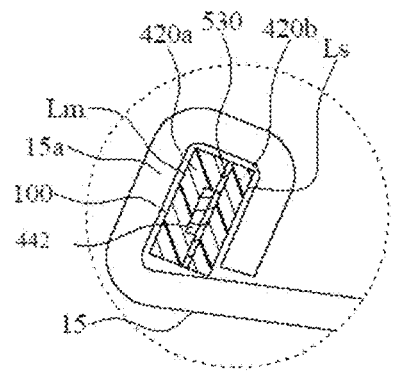
FIG. 6B illustrates an enlarged cross-sectional view of the dashed-line circle of FIG. 6A.

Please refer to FIG. 6B which illustrates an enlarged cross-sectional view of the dashed-line circle of FIG. 6A. The second end of each of the supporting arms 15 has a clamping portion 15a which clamps the body of the LED filament 100. The clamping portion 15a may, but not limited to, clamp at either the wave crest or the wave trough. Alternatively, the clamping portion 15a may clamp at the portion between the wave crest and the wave trough. The shape of the clamping portion 15a may be tightly fitted with the outer shape of the cross-section of the LED filament 100. The dimension of the inner shape (through hole) of the clamping portion 15a may be a little bit smaller than the outer shape of the cross-section of the LED filament 100. During manufacturing process, the LED filament 100 may be passed through the inner shape of the clamping portion 15a to form a tight fit. Alternatively, the clamping portion 15a may be formed by a bending process. Specifically, the LED filament 100 may be placed on the second end of the supporting arm 15 and a clamping tooling is used to bend the second end into the clamping portion to clamp the LED filament 100.

The supporting arms 15 may be, but not limited to, made of carbon steel spring to provide with adequate rigidity and flexibility so that the shock to the LED light bulb caused by external vibrations is absorbed and the LED filament 100 is not easily to be deformed. Since the stand 19a extending to the center of the lamp housing 12 and the supporting arms 15 are connected to a portion of the stand 19a near the top thereof, the position of the LED filaments 100 is at the level close to the center of the lamp housing 12. Accordingly, the illumination characteristics of the LED light bulb 20c are close to that of the traditional light bulb including illumination brightness. The illumination uniformity of LED light bulb 20c is better. In the embodiment, at least a half of the LED filaments 100 is around a center axle of the LED light bulb 20c. The center axle is coaxial with the axle of the stand 19a.

In the embodiment, the first end of the supporting arm 15 is connected with the stand 19a of the stem 19. The clamping portion of the second end of the supporting arm 15 is connected with the outer insulation surface of the LED filaments 100 such that the supporting arms 15 are not used as connections for electrical power transmission. In an embodiment where the stem 19 is made of glass, the stem 19 would not be cracked or exploded because of the thermal expansion of the supporting arms 15 of the LED light bulb 20c. Additionally, there may be no stand in an LED light bulb. The supporting arm 15 may be fixed to the stem or the lamp housing directly to eliminate the negative effect to illumination caused by the stand.

The supporting arm 15 is thus non-conductive to avoid a risk that the glass stem 19 may crack due to the thermal expansion and contraction of the metal filament in the supporting arm 15 under the circumstances that the supporting arm 15 is conductive and generates heat when current passes through the supporting arm 15.

In different embodiments, the second end of the supporting arm 15 may be directly inserted inside the LED filament 100 and become an auxiliary piece in the LED filament 100, which can enhance the mechanical strength of the LED filament 100. Relative embodiments are described later.

The LED filament 100 shown in FIG. 6A is curved to form a circular shape in a top view while the LED filament is curved to form a wave shape in a side view. The wave shaped structure is not only novel in appearance but also guarantees that the LED filament 100 illuminates evenly. In the meantime, the single LED filament 100, comparing to multiple LED filaments, requires less joint points (e.g., pressing points, fusing points, or welding points) for being connected to the conductive supports 51a, 51b. In practice, the single LED filament 100 (as shown in FIG. 6A) requires only two joint points respectively formed on the two conductive electrodes, which effectively lowers the risk of fault welding and simplifies the process of connection compared to the mechanically connection in the tightly pressing manner.

Figure 6C:
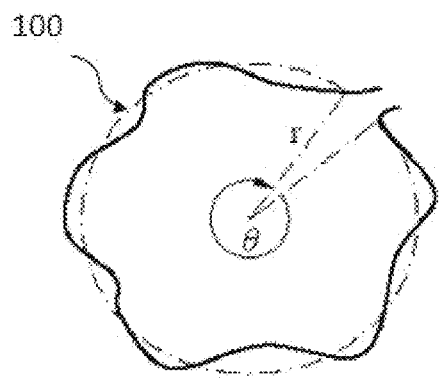
FIG. 6C is a projection of a top view of an LED filament of the LED light bulb of FIG. 6A.

Please refer to FIG. 6C. FIG. 6C is a projection of a top view of an LED filament of the LED light bulb 20c of FIG. 6A. As shown in FIG. 6C, in an embodiment, the LED filament may be curved to form a wave shape resembling a circle observed in a top view to surround the center of the light bulb or the stem. In different embodiments, the LED filament observed in the top view can form a quasi-circle or a quasi U shape.

As shown in FIG. 6B and FIG. 6C, the LED filament 100 surrounds with the wave shape resembling a circle and has a quasi-symmetric structure in the top view, and the lighting face of the LED filament 100 is also symmetric.

In an embodiment, the LED light bulb 20c shown in FIG. 6A may be a light bulb with an A size. The two joint points for electrical connection between the two conductive supports 51a, 51b and the LED filament 100 is spaced by a distance, which is within 3 cm and is preferably within 2 cm. The LED filament 100 surrounds with the wave shape; therefore, the LED filament 100 may generate an effect of an omnidirectional light, and the two joint points may be close to each other such that the conductive supports 51a, 51b are substantially below the LED filament 100. Visually, the conductive supports 51a, 51b keeps a low profile and is integrated with the LED filament 100 to show an elegance curvature. While being observed from a side of the LED filament 100 in the LED light bulb 20c, a distance between the highest point and the lowest point of the wave of the LED filament 100 is from 2.2 cm to 3.8 cm and is preferably from 2.2 cm to 2.8 cm. Thus it could be ensured that there would be a space for heat dissipation above the LED filament 100.

As shown in FIG. 6A, the shape of the LED filament 100 may satisfy a curve equation. The position of the LED filament 100 in space relates to the Cartesian coordinates (i.e., an xyz coordinates) shown in FIG. 6A. An x-y plane of the xyz coordinates is a plane passing through a top of the stem 19 (i.e., a top of the stand 19b in the embodiment in which the stand 19a is deemed as a part of the stem 19). An origin of the xyz coordinates is at the top of the stem 19 (the origin may be at a center of a sphere body of a lamp housing of a light bulb without any stems). The x-y plane is perpendicular to a height direction of the LED light bulb 20c.

The two conductive electrodes (i.e., the welding points, the joint points, the contacting points, or the fusing points) are symmetrically disposed at two sides of a y-axis of the xyz coordinates. A z-axis of the xyz coordinates is coaxial with stem 19 (or is coaxial with a central axis passing through a horizontal plane of the LED light bulb 20c). The shape of the LED filament 100 varies along an x-direction, a y-direction, and a z-direction according to t, and t is a variable between 0 and 1. A position of points of the LED filament 100 in the xyz coordinates is defined as X, Y, and Z and satisfies the curve equation. Herein, the term "points of the LED filament" means "most of points of the LED filament", or "more than 60% of points of the LED filament." The curve equation is:

$$X=m1*\cos(t*360),$$

$$Y=m2*\sin(t*360),$$

$$Z=n*\cos(t*360*k),$$

The LED filament 100 varies along the x-direction, the y-direction, and the z-direction according to t. When X=0, |Y|max=m2 (a max value of |Y| is m2), and |Z|max=n (a max value of |Z| is n). When Y=0, |X|max=m1 (a max value of |X| is m1), and |Z|max=n (the max value of |Z| is n). When Z=0, |X|max=m1 (the max value of |X| is m1), and |Y|max=m2 (the max value of |Y| is m2). m1 is a length (projection length) in the x-direction, and 24≤m1≤27 (mm). m2 is a length (projection length) in the y-direction, and 24≤m2≤27 (mm). Based upon the above configuration, the LED filament 100 in the lamp housing 12 may provide good luminous flux. n is a height of the highest point of the LED filament 100 from the x-y plane in the z-direction, and 0<n≤14 (mm). Based upon the above condition, wires in turning points of the LED filament 100 may hard to break. k is a number of the highest point(s). The more the supporting arms (or supporting bars), the hard the manufacture is; therefore, k is configured as: 2≤k≤8. A curve line drawn by the above curve equation may be deemed as a reference for the LED filament 100 being distributed in space. According to conditions of different arts and equipment, the configuration of the LED filament 100 in practice may have about 0 to 25% in spatial difference different from the reference based upon the curve equation. Certain region(s) on the filament with supporting point(s) may be relatively highest point(s) and lowest point(s). The spatial difference of the certain region(s) may be less, e.g., 0 to 20%. In an embodiment, r is the radius of a cross section of the lamp housing on the horizontal plane. Cross sections of the lamp housing on the horizontal plane from the bottom to the top of the lamp housing along the height direction may have varied radii, and the radius r is the one with the largest value. In such case, the values of m1, m2, and n may be set as: 0.8*r≤m1≤0.9*r; 0.8*r≤m2≤0.9*r; 0<n≤0.47*r. Additionally, p is the radius of an interface of the bulb base utilized for being connected to the lamp housing, G is the length of the LED filament, and, in such case, the values of G may be set as: 1.2*p≤G≤5.6*r. Based upon the above setting, the LED filament may not only achieve the aforementioned effect, but may also need the least length and the least number of the LED chips. As a result, the cost of materials for the manufacture of the LED light bulb may reduce, and the temperature of the LED light bulb during operation can be suppressed.

What is claimed is:

1. LED light bulb, comprising:
a lamp housing filled with gas, which doped with a golden yellow material or coated with a yellow film on its surface;
a bulb base, connected with the lamp housing;
a stem with a stand extending to a center of the lamp housing, disposed in the lamp housing;
an LED filament disposed in the lamp housing, at least a half of the LED filament is around a center axle of the LED light bulb, where the center axle of the LED light bulb is coaxial with an axle of the stand, and the LED filament comprising:
a plurality of LED sections, each of the plurality of LED sections including at least two LED chips electrically connected to each other through a wire;
at least one conductive section located between the adjacent two LED sections of the plurality of LED sections;
a light conversion layer with at least a top layer and a base layer opposite to the top layer of the light conversion layer, disposed on at least one side of the at least two LED chips; and
two conductive electrodes disposed on the base layer of the light conversion layer, where the light conversion layer is coated on at least two sides of the at least two LED chips and the two conductive electrodes and a portion of each of the two conductive electrodes is not coated with the light conversion layer;
two conductive supports, respectively connected with the stem and the LED filament;
a driving circuit, electrically connected with both the two conductive supports and the bulb base; and
a plurality of supporting arms, each of the plurality of supporting arms comprise a first end and a second end, where the first end of each of the plurality of supporting arms is connected with the stand of the stem while the second end of each of the plurality of supporting arms is connected with the LED filament;
wherein light emitted by one of the at least two LED chips passes through interfaces A, B, C, D, E and F respectively in the light bulb, where the interface A is an interface between p-GaN gate of each of the at least two LED chips and the top layer of the light conversion layer, the interface B is an interface between the top layer of the light conversion layer and the gas in the lamp housing, the interface C is an interface between each of the at least two LED chips and paste adjacent to the base layer of the light conversion layer, the interface D is an interface between the paste and the base layer of the light conversion layer, the interface E is an interface between the base layer of the light conversion layer and the gas in the lamp housing, and the interface F is an interface between the base layer of the light conversion layer and the top layer of the light conversion layer, and an absolute value of refractive index difference between the two substances in any one of the interfaces is less than 1.0;
wherein the base layer of the light conversion layer is formed from organosilicon-modified polyimide resin composition comprising an organosilicon-modified polyimide and a thermal curing agent, wherein the organosilicon-modified polyimide comprises a repeating unit represented by the following general formula (I):

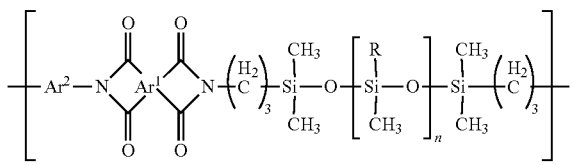

wherein $Ar^1$ is a tetra-valent organic group having a benzene ring or an alicyclic hydrocarbon structure, $Ar^2$ is a di-valent organic group having a monocyclic alicyclic hydrocarbon structure, R is each independently methyl or phenyl, n is 1-5;

wherein the organosilicon-modified polyimide has a number average molecular weight of 5000-100000; and
wherein the thermal curing agent is selected from the group consisting of epoxy resin, isocyanate and bisoxazoline compounds.

2. The light bulb of claim 1, wherein the absolute value of the refractive index difference between the two substances in any one of the four interfaces of B, E, D and F is less than 0.5.

3. The light bulb of claim 2, wherein the absolute value of the refractive index difference between the two substances in any one of the two interfaces of D and F is less than 0.2.

4. The light bulb of claim 3, wherein the shortest distance between two LED chips respectively located in the adjacent two LED sections is greater than the distance between adjacent two LED chips within the one LED section of the plurality of LED sections.

5. The light bulb of claim 4, wherein the top layer of the light conversion layer has different widths, thicknesses or diameters in the radial direction of the LED filaments for the plurality of LED sections and the at least one conductive section.

6. The light bulb of claim 5, wherein the shortest distance between two LED chips respectively located in the adjacent two LED sections is greater than the distance between adjacent two LED chips within the one LED section of the plurality of LED sections.

7. The light bulb of claim 6, wherein the top layer of the LED sections has a maximum diameter D2 in the radial direction of the LED filament, while the top layer of the at least one conductive section has the largest diameter in the radial direction of the LED filament, where D2 is greater than D1.

8. The light bulb of claim 7, wherein the at least one conductive section includes at least one conductor that connects the adjacent two LED sections, and the length of the wire is less than that of the conductor.

9. The light bulb of claim 8, wherein the maximum thickness of one LED chip of the plurality of LED sections in the radial direction of the filament is H, the thickness of the two conductive electrodes and the conductor in the radial direction of the filament respectively is 0.5 H to 1.4 H.

10. The light bulb of claim 9, wherein the thickness of the two conductive electrodes and the conductor in the radial direction of the filament respectively is 0.5 H to 0.7 H.

11. The light bulb of claim 10, wherein $Ar^1$ is a tetra-valent organic group having a monocyclic alicyclic hydrocarbon structure or a bridged-ring alicyclic hydrocarbon structure.

12. The light bulb of claim 11, wherein $Ar^2$ is a di-valent organic group comprising a functional group having active hydrogen, wherein the functional group having active hydrogen is any one of hydroxyl, amino, carboxy and mercapto.

13. The light bulb of claim 12, wherein $Ar^1$ is derived from a dianhydride, and $Ar^2$ is derived from a diamine.

14. The light bulb of claim 13, wherein the organosilicon-modified polyimide resin composition further comprises an additive selected from the group consisting of fluorescent powders, heat dispersing particles and a coupling agent.

15. The light bulb of claim 14, wherein the organosilicon-modified polyimide resin composition has a refractive index of 1.4-1.55.

16. The light bulb of claim 15, wherein the organosilicon-modified polyimide resin composition is prepared by vacuum defoaming, the vacuum used in the vacuum defoaming is −0.5--0.09 MPa.

17. The light bulb of claim 16, wherein the amount of the coupling agent=(the amount of the heat dispersing particles*the specific surface area of the heat dispersing particles)/the minimum coating area of the coupling agent.

18. The light bulb of claim 16, wherein the organosilicon-modified polyimide resin composition has thermal conductivity more than 1.65 under the condition of adding small particle size of below 1 μm, medium particle size of 1-30 μm and large particle size of above 30 μm.

19. The light bulb of claim 18, wherein each side of the LED sections is in direct contact with the top layer of the light conversion layer.

20. The light bulb of claim 18, wherein points of the LED filament in an xyz coordinates are defined as X, Y, and Z and satisfy a curve equation, an origin of xyz coordinates is at the stem top, an x-y plane of the xyz coordinates passes through the stem top and is perpendicular to the height direction, a z-axis of xyz coordinates is coaxial with stem, and the two conductive electrodes are symmetrically disposed at two sides of a y-axis of the xyz coordinates, the curve equation is:

$$X=m1*\cos(t*360),$$

$$Y=m2*\sin(t*360),$$

$$Z=n*\cos(t*360*k),$$

wherein, t is a variable between 0 and 1, the LED filament varies along an x-direction, a y-direction, and a z-direction according to t; wherein, when X=0, a max value of |Y| is m2, and a max value of |Z| is n; wherein, when Y=0, a max value of |X| is m1, and a max value of |Z| is n;

wherein, when Z=0, a max value of |X| is m1, and a max value of |Y| is m2; wherein m1 is a length in the x-direction, m2 is a length in the y-direction, n is a height of the highest point from the x-y plane in the z-direction, and k is a number of the highest point.

* * * * *